(12) United States Patent
Yang et al.

(10) Patent No.: US 12,004,389 B2
(45) Date of Patent: Jun. 4, 2024

(54) ARRAY SUBSTRATE, DISPLAY PANEL AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Huijuan Yang, Beijing (CN); Tingliang Liu, Beijing (CN); Shun Zhang, Beijing (CN); Pengfei Yu, Beijing (CN); Yu Wang, Beijing (CN); Hao Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 580 days.

(21) Appl. No.: 17/280,459

(22) PCT Filed: Jun. 30, 2020

(86) PCT No.: PCT/CN2020/099570
§ 371 (c)(1),
(2) Date: Mar. 26, 2021

(87) PCT Pub. No.: WO2022/000339
PCT Pub. Date: Jan. 6, 2022

(65) Prior Publication Data
US 2022/0208927 A1  Jun. 30, 2022

(51) Int. Cl.
*H01L 27/12*  (2006.01)
*G09G 3/3233*  (2016.01)
(Continued)

(52) U.S. Cl.
CPC ......... *H10K 59/131* (2023.02); *G09G 3/3233* (2013.01); *G09G 2300/0443* (2013.01);
(Continued)

(58) Field of Classification Search
CPC ............ H10K 59/131; H10K 59/1213; H10K 59/1216; G09G 3/3233; G09G 2300/0443; G09G 2300/0842; H01L 27/124
See application file for complete search history.

(56) References Cited

U.S. PATENT DOCUMENTS 10,607,058 B2  3/2020 Wang et al.
10,658,444 B2  5/2020 Kang et al.
(Continued)

FOREIGN PATENT DOCUMENTS

CN  108509899 A  9/2018
CN  108597374 A  9/2018
(Continued)

*Primary Examiner* — James A Dudek
(74) *Attorney, Agent, or Firm* — Dilworth & Barrese, LLP.; Michael J. Musella, Esq.

(57) ABSTRACT

An array substrate, a display panel, and a display device are provided. The array substrate includes sub-pixel includes a pixel circuit, and the pixel circuit includes a light emitting element, a storage capacitor, a driving transistor, a data writing transistor, a data line and a first connection structure. The driving transistor is configured to control the light emitting element to emit light; the data line is connected to the first electrode of the data writing transistor and configured to provide a data signal for the data writing transistor; the data writing transistor is configured to write the data signal into the gate electrode of the driving transistor; and the first connection structure is connected to both the gate electrode of the driving transistor and a first electrode plate (Continued)

of the storage capacitor, and the first connection structure and the data line are provided in different layers.

20 Claims, 10 Drawing Sheets

(51) Int. Cl.
*H10K 59/131* (2023.01)
*H10K 59/121* (2023.01)

(52) U.S. Cl.
CPC . *G09G 2300/0842* (2013.01); *G09G 2310/08* (2013.01); *H01L 27/124* (2013.01); *H10K 59/1213* (2023.02); *H10K 59/1216* (2023.02)

(56) References Cited

U.S. PATENT DOCUMENTS

| | | | |
|---|---|---|---|
| 10,936,842 B2 | 3/2021 | Gao et al. | |
| 2016/0322448 A1 | 11/2016 | Kim | |
| 2019/0303637 A1* | 10/2019 | Wang | G09G 3/3225 |
| 2020/0066212 A1* | 2/2020 | Kim | G09G 3/3233 |

FOREIGN PATENT DOCUMENTS

| | | | |
|---|---|---|---|
| CN | 110047436 A | 7/2019 | |
| CN | 110136650 A | 8/2019 | |
| CN | 110858471 A | 3/2020 | |
| KR | 20120052914 A | 5/2012 | |

* cited by examiner

ARRAY SUBSTRATE, DISPLAY PANEL AND DISPLAY DEVICE

TECHNICAL FIELD

At least one embodiment of the present disclosure relates to an array substrate, a display panel, and a display device.

BACKGROUND

Compared with traditional Liquid Crystal Displays (LCDs), Active Matrix Organic Light-Emitting Diode (AMOLED) displays have the advantages of self-luminescence, wide color gamut, high contrast, lightness and thinness, and thus are widely used in mobile phones, tablet computers or other fields, and also are widely used in flexible wearable products, such as smart watches. Typically, a pixel circuit is provided in the display area, and a gate driving circuit, for example a GOA (Gate On Array) driving circuit, is provided in a frame area to provide a driving signal to the pixel circuit.

SUMMARY

According to at least one embodiment of the disclosure, an array substrate is provided. The array substrate comprises a base substrate provided with a plurality of pixels arranged in an array, each of the plurality of pixels comprises a plurality of sub-pixels, each of the plurality of sub-pixels comprises a pixel circuit, and the pixel circuit comprises a light emitting element, a storage capacitor, a driving transistor, a data writing transistor, a data line and a first connection structure. Each of the driving transistor and the data writing transistor comprises an active layer, a gate electrode, a first electrode, and a second electrode, and the driving transistor is configured to control the light emitting element to emit light; the data line is connected to the first electrode of the data writing transistor and configured to provide a data signal for the data writing transistor; the data writing transistor is configured to write the data signal into the gate electrode of the driving transistor in response to a first scan signal applied to the gate electrode of the data writing transistor; and the first connection structure is connected to both the gate electrode of the driving transistor and a first electrode plate of the storage capacitor, and the first connection structure and the data line are provided in different layers.

For example, in the array substrate according to at least one embodiment of the disclosure, the data line and the first connection structure both extend along a first direction, and an orthographic projection of the first connection structure on the base substrate and an orthographic projection of the data line on the base substrate are at least partially opposite to each other in a lateral direction, the lateral direction is parallel to the base substrate and perpendicular to the first direction.

For example, in the array substrate according to at least one embodiment of the disclosure, a distance between an orthographic projection of the first connection structure on the base substrate and an orthographic projection of the data line on the base substrate is smaller than a size of one of the plurality of sub-pixels in a lateral direction.

For example, in the array substrate according to at least one embodiment of the disclosure, a gap or almost no gap is provided between the orthographic projection of the first connection structure on the base substrate and the orthographic projection of the data line on the base substrate.

For example, in the array substrate according to at least one embodiment of the disclosure, the gate electrode of the driving transistor and the first electrode plate of the storage capacitor are provided in a same layer.

For example, in the array substrate according to at least one embodiment of the disclosure, the gate electrode of the driving transistor and the first electrode plate of the storage capacitor are provided on a side of the active layer of the driving transistor away from the base substrate; a second electrode plate of the storage capacitor is provided on a side of the gate electrode of the driving transistor and the first electrode plate of the storage capacitor away from the active layer.

For example, in the array substrate according to at least one embodiment of the disclosure, the data line is provided on a side of the first connection structure away from the base substrate.

For example, the array substrate according to at least one embodiment of the disclosure further comprises: a semiconductor layer, comprising the active layer of the driving transistor; a first insulating layer, provided between the active layer and the gate electrode of the driving transistor as well as the first electrode plate of the storage capacitor; a second insulating layer, provided between the first electrode plate of the storage capacitor and the second electrode plate of the storage capacitor; a third insulating layer, provided between the second electrode plate of the storage capacitor and the first connection structure; a fourth insulating layer, provided between the first connection structure and the data line; a first via hole, penetrating through each of the first insulating layer, the second insulating layer, the third insulating layer and the fourth insulating layer and exposing a part of the semiconductor layer, in which the data line is electrically connected to the semiconductor layer through the first via hole; and a second via hole, penetrating through each of the second insulating layer and the third insulating layer and exposing a part of the first electrode plate of the storage capacitor, in which the first connection structure is connected to the first electrode plate of the storage capacitor through the second via hole.

For example, in the array substrate according to at least one embodiment of the disclosure, the data line is provided on a side of the first connection structure away from the base substrate.

For example, the array substrate according to at least one embodiment of the disclosure further comprises: a semiconductor layer, comprising the active layer of the driving transistor; a first insulating layer, provided between the active layer and the gate electrode of the driving transistor as well as the first electrode plate of the storage capacitor; a second insulating layer, provided between the first electrode plate of the storage capacitor and the second electrode plate of the storage capacitor; a third insulating layer, provided between the second electrode plate of the storage capacitor and the first connection structure; a fourth insulating layer, provided between the first connection structure and the data line; a first via hole, penetrating through each of the first insulating layer, the second insulating layer, the third insulating layer and the fourth insulating layer and exposing a part of the semiconductor layer, in which the data line is electrically connected to the semiconductor layer through the first via hole; and a second via hole, penetrating through each of the second insulating layer and the third insulating layer and exposing a part of the first electrode plate of the storage capacitor, in which the first connection structure is connected to the first electrode plate of the storage capacitor through the second via hole.

For example, in the array substrate according to at least one embodiment of the disclosure, a thickness of the fourth insulating layer in a direction perpendicular to the base substrate is greater than at least one of a thickness of the first insulating layer in the direction perpendicular to the base substrate, a thickness of the second insulating layer in the direction perpendicular to the base substrate, a thickness of the third insulating layer in the direction perpendicular to the base substrate, and a thickness of the fourth insulating layer in the direction perpendicular to the base substrate.

For example, the array substrate according to at least one embodiment of the disclosure further comprises: a first power line, connected to both a first voltage terminal and the second electrode plate of the storage capacitor and configured to provide a first voltage for a light-emitting control transistor; the first power line comprises a first sub-wire extending along a first direction and a second sub-wire extending along a second direction, the first direction intersects the second direction, and the first sub-wire is electrically connected to the second sub-wire.

For example, in the array substrate according to at least one embodiment of the disclosure, the first sub-wire and the first connection structure are provided in a same layer different from a layer in which the data line is provided; the second sub-wire and the second electrode plate of the storage capacitor are provided in a same layer.

For example, in the array substrate according to at least one embodiment of the disclosure, in one of the plurality of sub-pixels, the first connection structure is provided in a lateral direction between the first sub-wire and the data line.

For example, in the array substrate according to at least one embodiment of the disclosure, an orthographic projection of the first connection structure on the base substrate is not overlapped with an orthographic projection of the data line on the base substrate, and an orthographic projection of the first sub-wire on the base substrate is not overlapped with the orthographic projection of the data line on the base substrate.

For example, the array substrate according to at least one embodiment of the disclosure further comprises: a third via hole, in which the first sub-wire is electrically connected to the second sub-wire through the third via hole.

For example, in the array substrate according to at least one embodiment of the disclosure, each of the data line and the first connection structure is made from a metallic material.

For example, the array substrate according to at least one embodiment of the disclosure further comprises a reset signal line. The plurality of sub-pixels comprise a first sub-pixel and a second sub-pixel adjacent to the first sub-pixel; the pixel circuit further comprises: a reset transistor, configured to provide a reset signal for the sub-pixel and comprising an active layer, a gate electrode, a first electrode, and a second electrode, in which the active layer of the reset transistor comprises a channel region and an electrode region; and a second connection structure, extending along the first direction and comprising a first end and a second end opposite to each other in the first direction; the second connection structure of the pixel circuit of the second sub-pixel is provided on a side, close to the data line of the pixel circuit of the first sub-pixel, of the channel region of the active layer of the reset transistor in the pixel circuit of the first sub-pixel in the lateral direction; the first end of the second connection structure of the pixel circuit of the second sub-pixel is electrically connected to the reset signal line, and the second end of the second connection structure is electrically connected to the electrode region of the active layer of the reset transistor in the pixel circuit of the second sub-pixel.

For example, in the array substrate according to at least one embodiment of the disclosure, the electrode region of the active layer of the reset transistor in the pixel circuit of the second sub-pixel extends from the first sub-pixel into the second sub-pixel along the lateral direction; and an orthographic projection of the electrode region of the active layer of the reset transistor of the pixel circuit of the second sub-pixel on the base substrate is at least partially overlapped with an orthographic projection of the data line belonging to the pixel circuit of the first sub-pixel on the base substrate.

For example, in the array substrate according to at least one embodiment of the disclosure, the second connection structure and the first connection structure are provided in a same layer.

According to at least on embodiment of the disclosure, a display panel is provided. The display panel comprises the array substrate as described above.

According to at least on embodiment of the disclosure, a display device is provided. The display device comprises the display panel as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
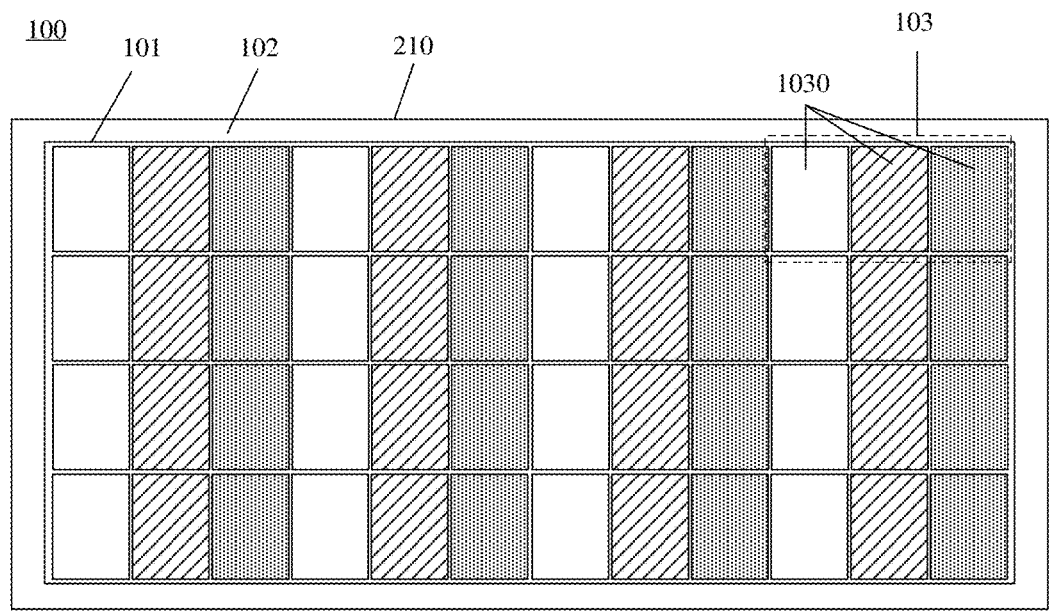
FIG. 1 is an overall schematic diagram of an array substrate provided by embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "up", "down", "left", "right" and the like are only used for expressing relative positional relationship, the relative positional relationship may be correspondingly changed in the case that the absolute position of a described object is changed.

The drawings in the present disclosure are not drawn strictly according to actual scale. The total numbers of pixels and sub-pixels in the display area is not limited to the number shown in the drawings. The specific size of each structure and the total number of each structure may be determined according to actual needs. The drawings described in the present disclosure are only structurally schematic diagrams.

With the development of Organic Light-Emitting Diode (OLED) display panels towards high resolution and large size, the size of unit pixel circuit is reduced, which leads to reductions in the line width and line spacing in the display area in the display panel, and in turns increases the parasitic capacitance between the signal lines, moreover, it also causes the interference between the signal lines to increase, which may lead to unsatisfactory display effects.

At least one embodiment of the present disclosure provides an array substrate. The array substrate includes a base substrate on which a plurality of pixels arranged in an array are provided; each of the plurality of pixels includes a plurality of sub-pixels, each of the plurality of sub-pixels includes a pixel circuit, and the pixel circuit includes a light emitting element, a storage capacitor, a driving transistor, a data writing transistor, a data line and a first connection structure. Each of the driving transistor and the data writing transistor includes an active layer, a gate electrode, a first electrode, and a second electrode, and the driving transistor is configured to control a driving current for driving the light emitting element to emit light; the data line is connected to the first electrode of the data writing transistor and configured to provide a data signal for controlling a display gray scale of the sub-pixel to the data writing transistor; the data writing transistor is configured to write the data signal into the gate electrode of the driving transistor in response to a first scan signal applied to the gate electrode of the data writing transistor; the first connection structure is connected to both the gate electrode of the driving transistor and a first electrode plate of the storage capacitor, the first connection structure and the data line are provided in different layers. For example, the array substrate is a display substrate.

Figure 2:
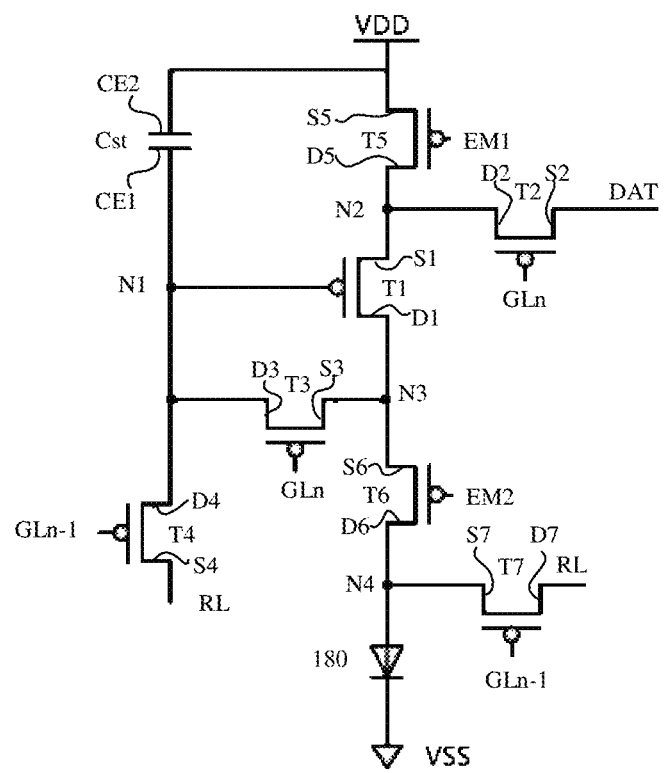
FIG. 2 is an equivalent circuit diagram of a pixel circuit in the array substrate provided by the embodiments of the present disclosure.
Figure 3A:
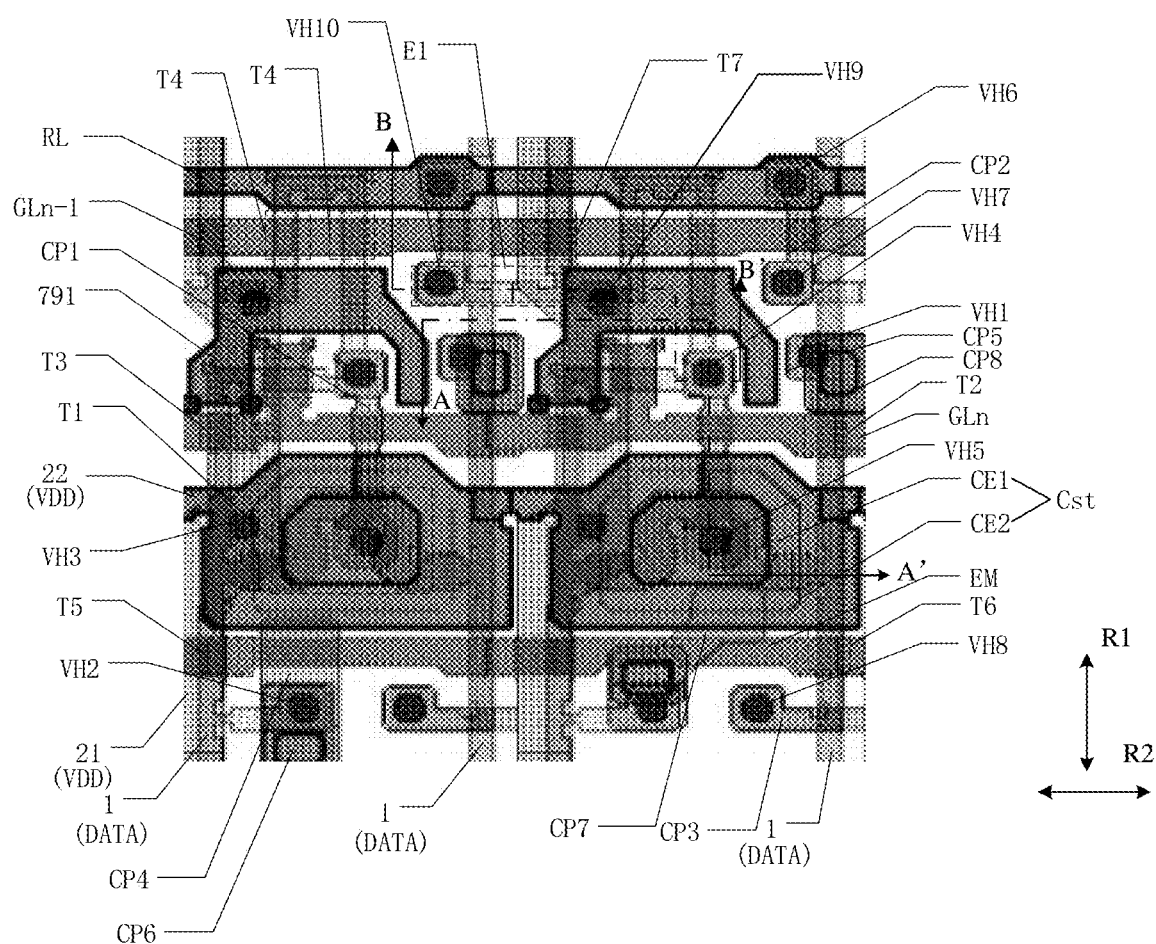
FIG. 3A is a schematic diagram of a planar layout of the pixel circuit in the array substrate provided by the embodiments of the present disclosure.

Exemplarily, FIG. 1 is an overall schematic diagram of an array substrate provided by the embodiments of the present disclosure, FIG. 2 is an equivalent circuit diagram of a pixel circuit in the array substrate provided by the embodiments of the present disclosure, and FIG. 3A is a schematic diagram of a planar layout of the pixel circuit in the array substrate provided by the embodiments of the present disclosure. FIG. 3A takes the layer structure of pixel circuits in two adjacent sub-pixels 1030 as an example.

With reference to FIGS. 1, 2 and 3A, the array substrate 100 includes a base substrate 210. For example, the base substrate 210 includes a display area 101 and a non-display area 102 at least partially surrounding the display area 101. For example, a plurality of pixels 103 arranged in an array are provided in the display area 101. Each of the plurality of pixels 103 includes a plurality of sub-pixels 1030, for example, each pixel 103 includes three sub-pixels 1030. Each of the plurality of sub-pixels 1030 includes a pixel circuit; the pixel circuit includes a light emitting element, a storage capacitor Cst, a driving transistor T1 (hereinafter also referred to as a first thin-film transistor), a data writing transistor T2 (hereinafter also referred to as a second thin-film transistor), a data line 1, and a first connection structure CP1. Each of the driving transistor T1 and the data writing transistor T2 includes an active layer, a gate electrode, a first electrode, and a second electrode. The driving transistor T1 is configured to control the light emitting element to emit light, for example, to control a driving current for driving the light emitting element to emit light. The data line 1 is connected to the first electrode of the data writing transistor T2 and is configured to provide the data writing transistor T2 with a data signal for controlling the display gray scale of the sub-pixel 1030. The data writing transistor T2 is configured to write the data signal to the gate electrode of the driving transistor T1 in response to a first scan signal applied to the gate electrode of the data writing transistor T2. The first connection structure CP1 is connected to the gate electrode of the driving transistor T1 and the first electrode plate of the storage capacitor Cst. The first connection structure CP1 and the data line 1 are provided in different layers, that is, the first connection structure CP1 and the data line 1 are arranged in different layers respectively, and an insulating layer is provided between the first connection structure CP1 and the data line 1 in a direction perpendicular to the base substrate 210. In the pixel circuit shown in FIGS. 2 and 3A, if the first connection structure CP1 and the data line 1 are provided in the same layer, the distance between the first connection structure CP1 and the data line 1 is relatively small, which will cause a relatively large parasitic capacitance to be formed in a lateral direction between the first connection structure CP1 and the data line 1, especially in a high-resolution display panel, this phenomenon is particularly serious. The parasitic capacitance will directly lead to unsatisfactory display effect. Moreover, the parasitic capacitance formed between the first connection structure CP1 and the data line 1 is unstable, because the data signal provided to the data line 1 is constantly changed during the display process; while the data signal is written into the gate electrode of the driving transistor T1, i.e., the data signal is written into the N1 node in FIG. 2, a sudden signal transition at the N1 node is caused, thereby affecting the fluctuation of the current flowing through the N1 node and in turns affecting the display effect. The first connection structure CP1 is the actual structure corresponding to the N1 node in FIG. 2; thus, in the array substrate provided by the embodiments of the present disclosure, providing the first connection structure CP1 and the data line 1 in different layers can reduce or avoid the formation of the parasitic capacitance between the first connection structure CP1 and the data line 1, thereby improving or avoiding the adverse effects on the display effect and achieving more ideal display effect.

It should be noted that, due to the array arrangement of pixels, the above-mentioned parasitic capacitance (represented by the parasitic capacitance 1 below) may be formed between the data line 1 and the first connection structure CP1 both corresponding to the same sub-pixel 1030, or the above-mentioned parasitic capacitance (represented by parasitic capacitance 2 below) may also be formed between the data line 1 and the first connection structure CP1 respectively corresponding to two adjacent sub-pixels. In the case that the first connection structure CP1 and the data line 1 are arranged in the same layer, the simulation test is that: the value of the parasitic capacitance 1 reaches 0.07971 fF, the value of parasitic capacitance 2 reaches 0.05627 fF, and the crosstalk degree of the parasitic capacitances 1 and 2 on the node N1 is 0.678%. The greater the value of the crosstalk degree is, the greater the interference is formed, and the greater the adverse effect on the display is caused.

In the array substrate provided by the embodiments of the present disclosure, the value of the parasitic capacitance 1 is about 0.0321 fF, the value of the parasitic capacitance 2 is 0.0242 fF, and the crosstalk degree of the parasitic capacitances 1 and 2 on the N1 node is 0.218%. It can be seen that the values of the parasitic capacitance 1 and the parasitic capacitance 2 in the array substrate provided by the embodiments of the present disclosure are significantly reduced compared to the case where the first connection structure and the data line are arranged in the same layer, and the crosstalk degree on the N1 node is significantly reduced, thereby significantly alleviating the adverse effect on the display.

As shown in FIG. 2, in some embodiments, the pixel circuit includes a plurality of thin-film transistors, for example, a first thin-film transistor T1, a second thin-film transistor T2, a third thin-film transistor T3, a fourth thin-film transistor T4, a fifth thin-film transistor T5, a sixth thin-film transistor T6, and a seventh thin-film transistor T7. For example, the pixel circuit further includes a plurality of signal lines and the storage capacitor Cst; the plurality of signal lines are connected to the plurality of thin-film transistors T1, T2, T3, T4, T5, T6, T7. That is, the pixel circuit in the embodiments has a 7T1C structure. For example, the plurality of signal lines include a gate line GLn/GLn–1 (i.e., a scan signal line), a light-emitting control line EM, a reset signal line RL, a data line DAT, and a first power line VDD. The gate line GLn/GLn–1 for example includes a first gate line GLn and a second gate line GLn–1. For example, the first gate line GLn is configured to transmit a gate scan signal, and the second gate line GLn–1 is configured to transmit a reset voltage signal. The light-emitting control line EM is configured to transmit a light-emitting control signal, for example, is connected to a first light-emitting control terminal EM1 and a second light-emitting control terminal EM2. A gate electrode of the fifth thin-film transistor T5 is connected to the first light-emitting control terminal EM1 or serves as the first light-emitting control terminal EM1 to receive the first light-emitting control signal. A gate electrode of the sixth thin-film transistor T6 is connected to the second light-emitting control terminal EM2 or serves as the second light-emitting control terminal EM2 to receive the second light-emitting control signal.

It should be noted that the embodiments of the present disclosure include, but are not limited to, the pixel circuit adopting the above-mentioned 7T1C structure. The pixel circuit may also adopt other types of circuit structures, such as 7T2C structure or 9T2C structure, which is not limited in the embodiments of the present disclosure.

For example, as shown in FIG. 2, a first gate electrode of the first thin-film transistor T1 is electrically connected to a third drain electrode D3 of the third thin-film transistor T3 and a fourth drain electrode D4 of the fourth thin-film transistor T4. A first source electrode S1 of the first thin-film transistor T1 is electrically connected to a second drain electrode D2 of the second thin-film transistor T2 and a fifth drain electrode D5 of the fifth thin-film transistor T5. A first drain electrode D1 of the first thin-film transistor T1 is electrically connected to a third source electrode S3 of the third thin-film transistor T3 and a sixth source electrode S6 of the sixth thin-film transistor T6.

For example, as shown in FIG. 2, a second gate electrode of the second thin-film transistor T2 is configured to be electrically connected to the first gate line GLn to receive the gate scan signal; a second source electrode S2 of the second thin-film transistor T2 is configured to be electrically connected to the data line DAT to receive the data signal; the second drain electrode D2 of the second thin-film transistor T2 is electrically connected to the first source electrode S1 of the first thin-film transistor T1.

For example, as shown in FIG. 2, a third gate electrode of the third thin-film transistor T3 is configured to be electrically connected to the first gate line GLn; a third source electrode S3 of the third thin-film transistor T3 is connected to the first drain electrode D1 of the first thin-film transistor T1; a third drain electrode D3 of the third thin-film transistor T3 is electrically connected to the first gate electrode of the first thin-film transistor T1.

For example, as shown in FIG. 2, a fourth gate electrode of the fourth thin-film transistor T4 is configured to be electrically connected to the second gate line GLn–1 to receive the reset voltage signal; a fourth source electrode S4 of the fourth thin-film transistor T4 is configured to be electrically connected to the reset signal line RL to receive the reset voltage signal; a fourth drain electrode D4 of the fourth thin-film transistor T4 is electrically connected to the first gate electrode of the first thin-film transistor T1.

For example, as shown in FIG. 2, a fifth gate electrode of the fifth thin-film transistor T5 is configured to be electrically connected to the light-emitting control line EM to receive the light-emitting control signal; a fifth source electrode S5 of the fifth thin-film transistor T5 is configured to be electrically connected to the first power line VDD to receive the first power signal; and a fifth drain D5 of the fifth thin-film transistor T5 is electrically connected to the first source electrode S1 of the first thin-film transistor T1.

Figure 3B:
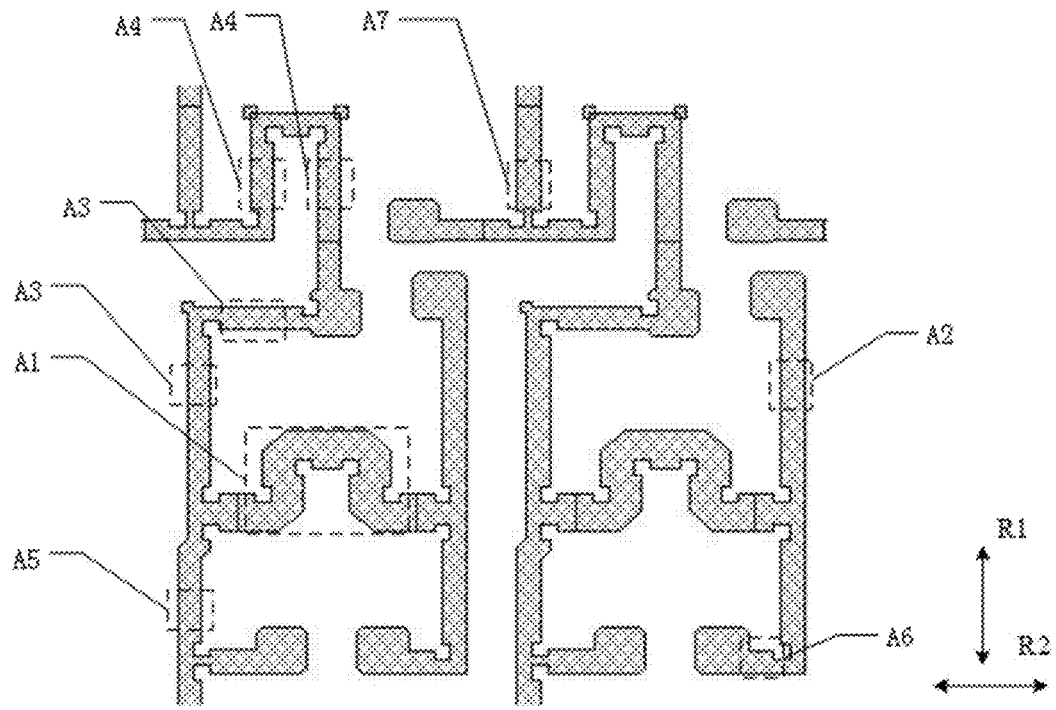
FIG. 3B to 3K are schematic diagrams of various layers of the pixel circuit of the array substrate provided by the embodiments of the present disclosure.
Figure 3C:
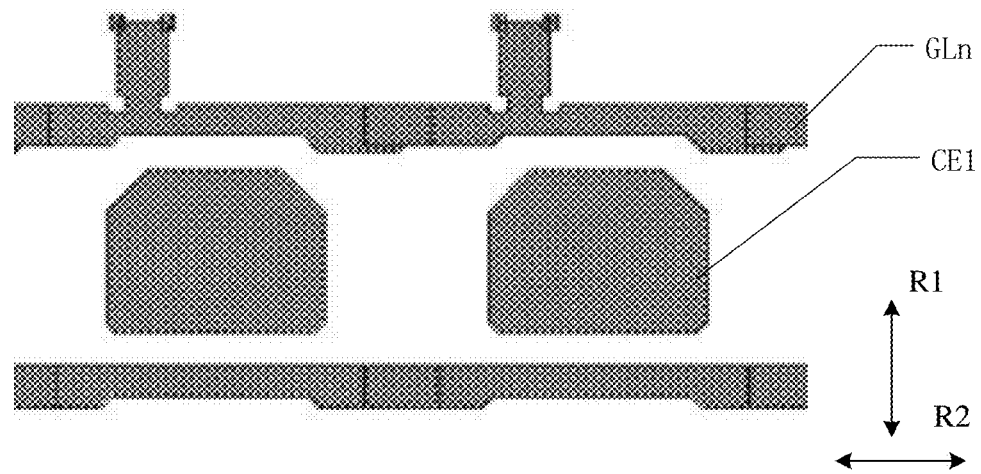
Figure 6:
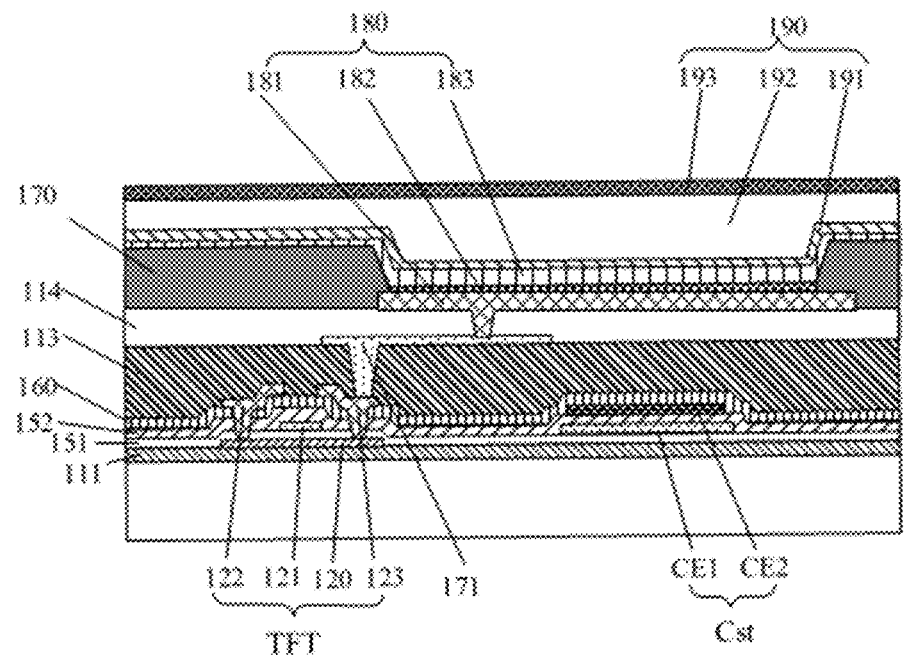
FIG. 6 is a schematic cross-sectional diagram of a part of a sub-pixel of the array substrate in FIG. 1.

For example, as shown in FIG. 2, a sixth gate electrode of the sixth thin-film transistor T6 is configured to be electrically connected to the light-emitting control line EM to receive the light-emitting control signal; a sixth source electrode S6 of the sixth thin-film transistor T6 is electrically connected to the first drain electrode D1 of the first thin-film transistor T1; and a sixth drain electrode D6 of the sixth thin-film transistor T6 is electrically connected to a first display electrode (for example, an anode 181 shown in FIG. 6) of the light emitting element (for example, a light emitting element 180 shown in FIG. 6). The thin-film transistor TFT in FIGS. 3A-3C is the sixth thin-film transistor T6.

For example, as shown in FIG. 2, a seventh gate electrode of the seventh thin-film transistor T7 is configured to be electrically connected to the second gate line GLn–1 to receive the reset voltage signal; a seventh source electrode S7 of the seventh thin-film transistor T7 is electrically connected to the first display electrode (for example, the anode 181 shown in FIG. 6) of the light emitting element; and a seventh drain electrode D7 of the seventh thin-film transistor T7 is configured to be electrically connected to the reset signal line RL to receive the reset voltage signal. For example, the seventh drain electrode D7 of the seventh thin-film transistor T7 is electrically connected to the reset signal line RL by being electrically connected with the fourth source electrode S4 of the fourth thin-film transistor T4.

In the embodiments, the fourth thin-film transistor T4 and the seventh thin-film transistor T7 are reset transistors, which are configured to provide a reset signal to the sub-pixel.

It should be noted that the above-mentioned reset voltage signal and the above-mentioned reset signal may be the same signal.

It should be noted that the transistors used in the embodiments of the present disclosure may be thin-film transistors, field-effect transistors, or other switching devices with the same characteristics. The thin-film transistors may include oxide semiconductor thin-film transistors, amorphous silicon thin-film transistors, or polysilicon thin-film transistors and so on. In the embodiments of the present disclosure, the first electrode of any one of the transistors is the source electrode, and the second electrode is the drain electrode; alternatively, the first electrode of any one of the transistors is the drain electrode, and the second electrode is the source electrode. The source electrode and the drain electrode of each transistor may be symmetrical in structure, so the source electrode and the drain electrode may be substantially same as each other in physical structure. In the embodiments of the present disclosure, the source electrode and the drain electrode of all or part of the transistors are interchangeable according to requirements.

Figure 3D:
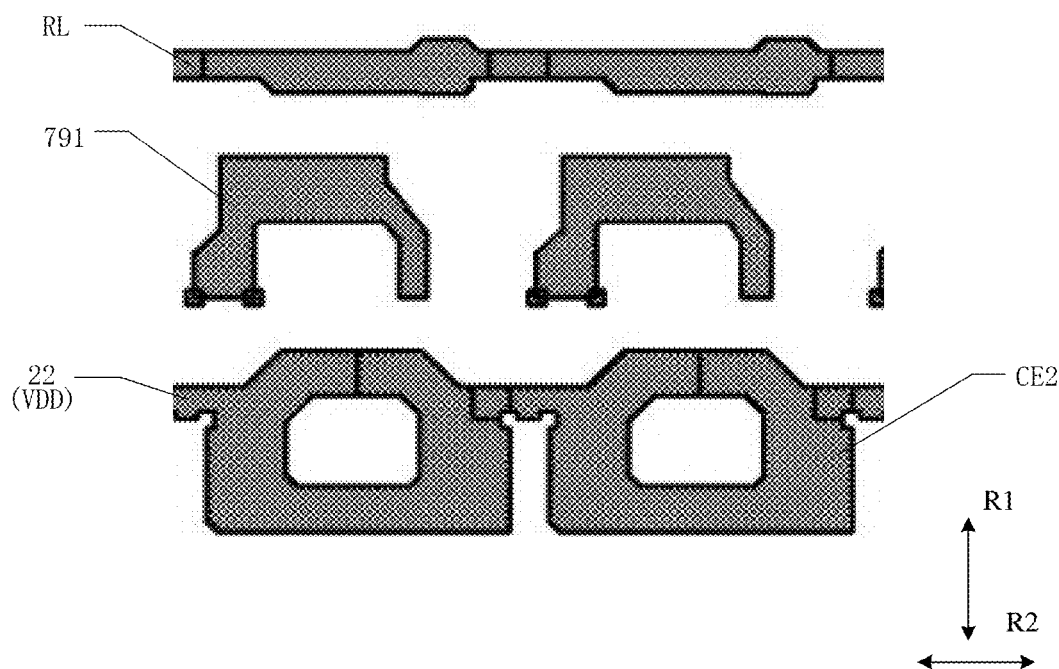
Figure 3E:
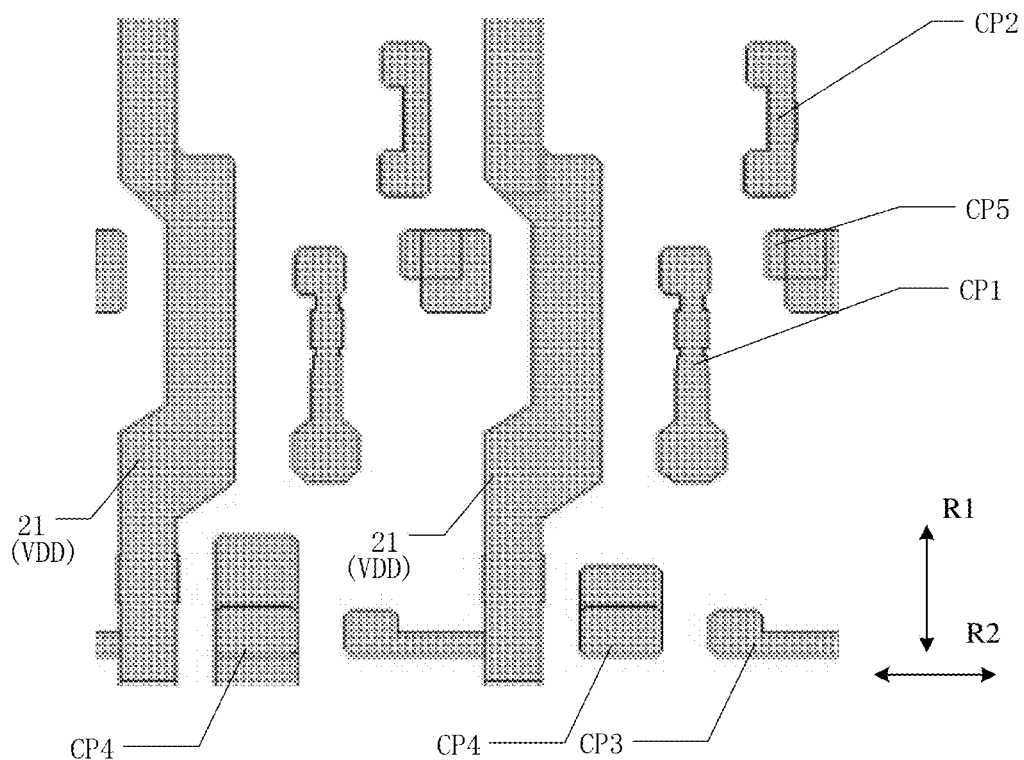
Figure 3F:
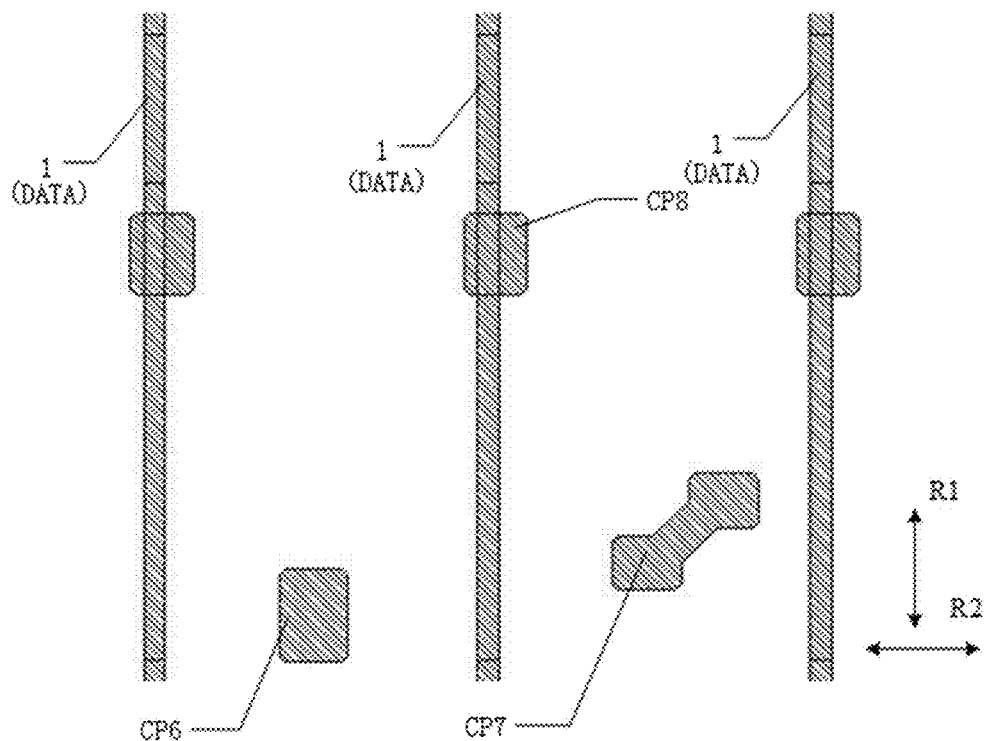
Figure 4A:
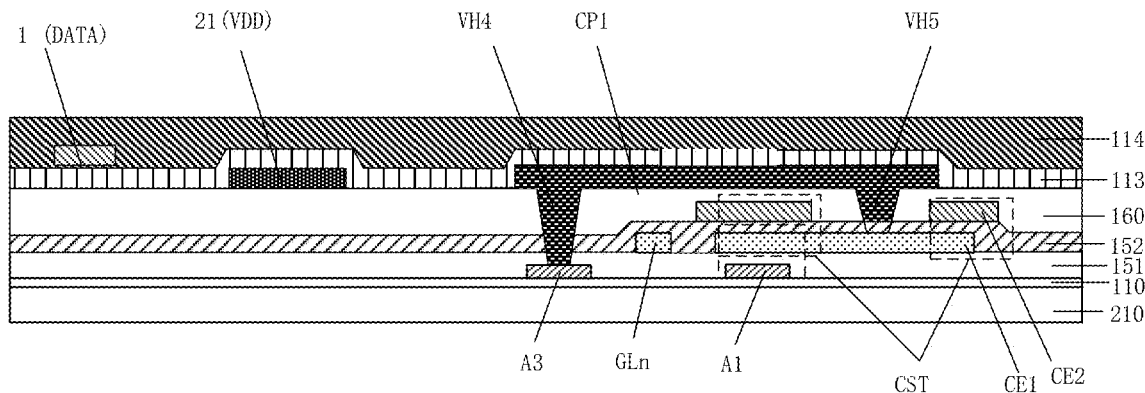
FIG. 4A is a schematic cross-sectional diagram taken along the line A-A' in FIG. 3A.

FIGS. 3B-3F are schematic diagrams of various layers of the pixel circuit of the array substrate provided by the embodiments of the present disclosure, and FIG. 4A is a schematic cross-sectional diagram taken along line A-A' in FIG. 3A.

In some embodiments, as shown in FIG. 3A, the pixel circuit includes the above-mentioned thin-film transistors T3, T4, T5, T6, T7, and the storage capacitor Cst; the pixel circuit further includes: the first gate line GLn, the second gate line GLn−1, the light-emitting control line EM, the reset signal line RL, the data line DAT, and the first power line VDD, which are connected to the plurality of thin-film transistors T1, T2, T3, T4, T5, T6, and T7.

Hereinafter, specific features of the structure of the pixel circuit in the embodiments of the present disclosure will be described with reference to FIGS. 3A-3F and FIG. 4A.

As shown in FIGS. 3A and 4A, the data line 1 and the first connection structure CP1 both extend along a first direction R1, an orthographic projection of the first connection structure CP1 on the base substrate 210 and an orthographic projection of the data line 1 on the base substrate 210 are at least partially opposite to each other in a lateral direction R2. This structure is conducive to achieve a compact structure of the pixel circuit. In this case, if the data line 1 and the first connection structure CP1 are arranged in the same layer, the parasitic capacitance between the two will be particularly significant. The arrangement according to the embodiments of the disclosure can not only alleviate or avoid the above-mentioned parasitic capacitance, but also achieve the compact structure of the pixel circuit, which is conducive to achieve high resolution of the array substrate. The lateral direction R2 is parallel to the base substrate 210 and perpendicular to the first direction R1.

For example, the distance between the orthographic projection of the first connection structure CP1 on the base substrate 210 and the orthographic projection of the data line 1 on the base substrate 210 (a maximum distance from an edge of the orthographic projection of the first connection structure CP1 on the base substrate 210 close to the orthographic projection of the data line 1 on the base substrate 210 to an edge of the orthographic projection of the data line 1 on the base substrate 210 close to the orthographic projection of the first connection structure CP1 on the base substrate 210) is smaller than the size of the sub-pixel 1030 in the lateral direction, which is further conducive to achieve the compact structure of the pixel circuit. Even if the distance between the first connection structure CP1 and the data line 1 in the lateral direction R2 is quite small, the above-mentioned parasitic capacitance phenomenon will not occur. For example, the distance between the data line 1 and the first connection structure CP1 both corresponding to the same sub-pixel 1030 is smaller than the size of one sub-pixel 1030 in the lateral direction R2, and the distance between the data line 1 and the first connection structure CP1 respectively corresponding to two adjacent sub-pixels is smaller than the size of one sub-pixel 1030 in the lateral direction R2. For example, the size of one sub-pixel 1030 in the lateral direction R2 is ranged from 30 μm to 90 μm.

Further, for example, there is a gap between the orthographic projection of the first connection structure CP1 on the base substrate 210 and the orthographic projection of the data line 1 on the base substrate 210. Alternatively, in some embodiments, there is almost no gap between the orthographic projection of the first connection structure CP1 on the base substrate 210 and the orthographic projection of the data line 1 on the base substrate 210. That is, the two orthographic projections are substantially connected to each other, which is conducive to achieve high resolution. In this case, the array substrate provided by the embodiments of the present disclosure can simultaneously prevent the above-mentioned parasitic capacitance phenomenon.

For example, the pixel circuit includes a semiconductor layer, a first conductive layer, a second conductive layer, and a third conductive layer. FIG. 3A is a schematic diagram of a layout which shows the lamination position relationship of the semiconductor layer, the first conductive layer, the second conductive layer, and the third conductive layer of the pixel circuit.

FIG. 3B shows the semiconductor layer of the pixel circuit. For example, the semiconductor layer shown in FIG. 3B includes an active layer A1 of the first thin-film transistor T1, an active layer A2 of the second thin-film transistor T2, an active layer A3 of the third thin-film transistor T3, and an active layer A4 of the fourth thin-film transistor T4, an active layer A5 of the fifth thin-film transistor T5, an active layer A6 of the sixth thin-film transistor T6, and an active layer A7 of the seventh thin-film transistor T7. As shown in FIG. 3B, the semiconductor layer may be formed by a patterning process using a semiconductor material layer. The semiconductor layer may be used to fabricate the above-mentioned active layers. The active layer of each transistor may include a source region, a drain region, and a channel region between the source region and the drain region. For example, the semiconductor layer is made from amorphous silicon, polysilicon, or oxide semiconductor material (for example, indium gallium tin oxide (IGZO)), etc. It should be noted that the above-mentioned source and drain regions may be regions doped with n-type impurities or p-type impurities.

In the array substrate provided by some embodiments of the present disclosure, a first insulating layer is formed on the above-mentioned semiconductor layer. For the sake of clarity, various insulating layers are not shown in FIGS. 3A and 3B-3K. For example, with reference to FIGS. 3B and 4A, the first insulating layer 151 of the pixel circuit is provided on a side of the semiconductor layer away from the base substrate 210.

Figure 3G:
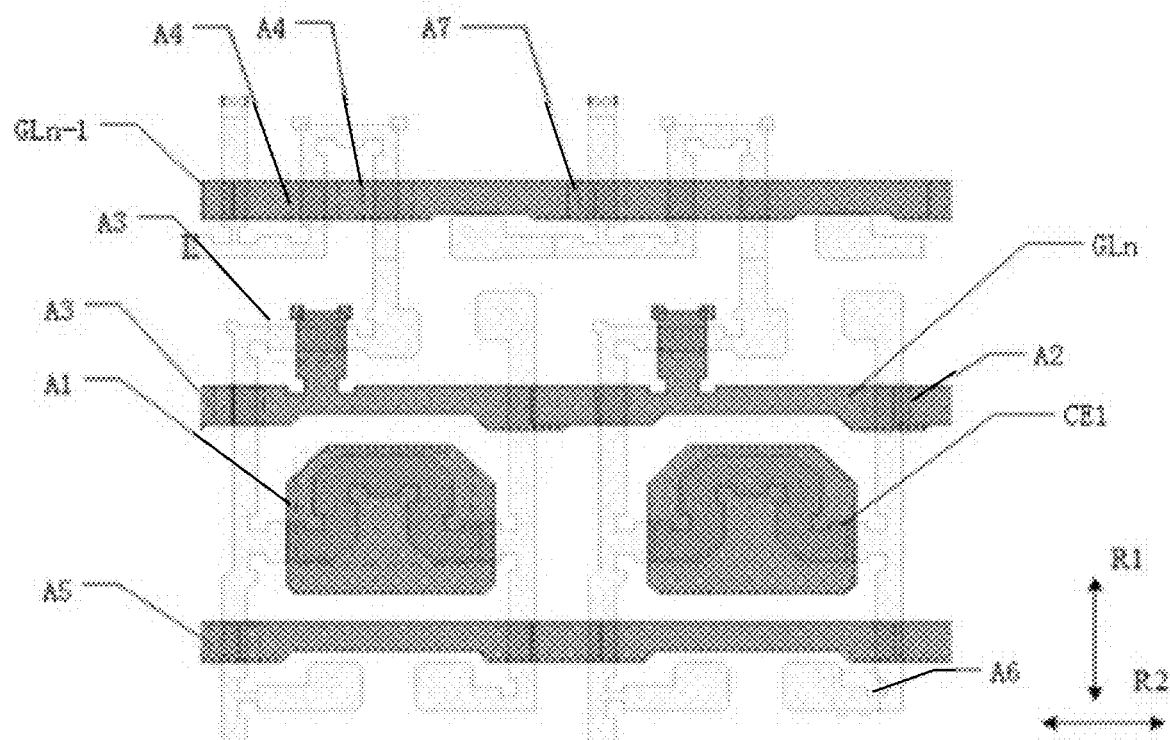

FIG. 3C shows the first conductive layer of the pixel circuit, and FIG. 3G shows a schematic diagram after the first conductive layer and the semiconductor layer are laminated. The first conductive layer is provided on a side of the semiconductor layer away from the base substrate 210. With reference to FIGS. 3C, 3G, and 4A, the first insulating layer 151 is provided between the active layer of each transistor and the first conductive layer. For example, the first conductive layer includes the first electrode plate CE1 of the storage capacitor Cst, the first gate line GLn, the second gate line GLn−1, the light-emitting control line EM, and the gate electrode of the first thin-film transistor T1, the gate electrode of second thin-film transistor T2, the gate electrode of the third thin-film transistor T3, the gate electrode of the fourth thin-film transistor T4, the gate electrode of the fifth thin-film transistor T5, the gate electrode of the sixth thin-film transistor T6, and the gate electrode of the seventh thin-film transistor T7. Thus, the active layers of the above-mentioned transistors are arranged in the same layer, and the gate electrodes of the above-mentioned transistors and the first electrode plate CE1 of the storage capacitor Cst are arranged in the same layer, so that the first insulating layer 151 is provided between the active layer of each transistor and the gate electrode of each transistor as well as the first electrode plate CE1 of the storage capacitor Cst. It can be seen that the gate electrode of the driving transistor (or the gate electrode of each transistor), that is, the gate electrode of the first thin-film transistor T1, and the first electrode plate CE1 of the storage capacitor Cst are provided on the side of the active layer of the driving transistor (or the active layer of each transistor) far away from the base substrate 210.

As shown in FIGS. 3A to 3C and FIG. 3G, the gate electrode of the second thin-film transistor T2, the gate electrode of the fourth thin-film transistor T4, the gate electrode of the fifth thin-film transistor T5, the gate electrode of the sixth thin-film transistor T6, and the gate electrode of the seventh thin-film transistor T7 are parts of the first gate line GLn or the second gate line GLn−1 which are overlapped with the semiconductor layer respectively. In some embodiments, for example, the third thin-film transistor T3 is a thin-film transistor with a double-gate structure; one gate electrode of the third thin-film transistor T3 is a part of the first gate line GLn overlapped with the semiconductor layer, and the other gate electrode of the third thin-film transistor T3 is a protrusion part protruding from the first gate line GLn. The gate electrode of the first thin-film transistor T1 for example formed integrally with the first electrode plate CE1, that is, the first electrode plate CE1 is also used as the gate electrode of the first thin-film transistor T1. For example, the fourth thin-film transistor T4 is a thin-film transistor with a double-gate structure, and the two gate electrodes of the fourth thin-film transistor T4 are parts of the second gate line GLn−1 overlapped with the semiconductor layer respectively.

For example, the gate electrodes of the above-mentioned thin-film transistors are respectively integrally formed with the corresponding first gate line GLn or the corresponding second gate line GLn−1. In the embodiments, the first gate line GLn, the second gate line GLn−1, the gate electrode of each thin-film transistor, and the first electrode plate CE1 of the storage capacitor Cst are arranged in the same layer and are formed simultaneously by the same patterning process.

For example, as shown in FIG. 3A, the array substrate 100 further includes a first power line VDD, the first power line VDD is connected to a first voltage terminal and the second electrode plate CE2 of the storage capacitor Cst and is configured to provide a first voltage for the light-emitting control transistor, i.e., the first thin-film transistor T1. For example, the first power line VDD includes a first sub-wire 21 extending in the first direction R1 and a second sub-wire 22 extending in a second direction. The first direction R1 intersects the second direction, for example, the second direction is the lateral direction R2. The first sub-wire 21 is electrically connected to the second sub-wire 22.

Figure 3H:
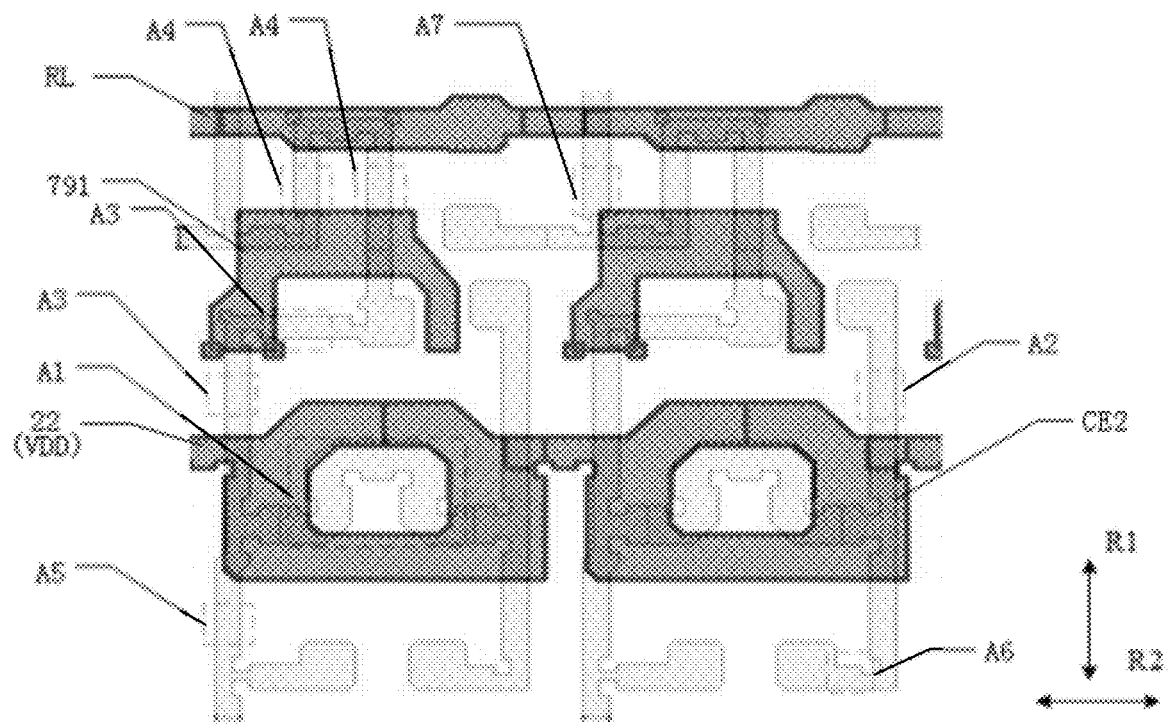

FIG. 3D shows the second conductive layer of the pixel circuit, and FIG. 3H shows a schematic diagram after the second conductive layer and the semiconductor layer are laminated. The second conductive layer is provided on a side of the first conductive layer away from the base substrate 210. For example, with reference to FIG. 3D, FIG. 3H and FIG. 4A, the second conductive layer of the pixel circuit includes the second electrode plate CE2 of the storage capacitor Cst, the reset signal line RL, and the second sub-wire 22. It can be seen that the second sub-wire 22 and the second electrode plate CE2 of the storage capacitor Cst are arranged in the same layer, and the second electrode plate CE2 of the storage capacitor Cst is provided on a side of the gate electrode of the driving transistor (or the gate electrode of each transistor), that is, the gate electrode of the first thin-film transistor T1, as well as the first electrode plate CE1 of the storage capacitor Cst away from the active layer. For example, the second sub-wire 22 is integrally formed with the second electrode plate CE2 of the storage capacitor Cst, so that they can be formed simultaneously by the same patterning process. The second electrode plate CE2 and the first electrode plate CE1 are at least partially overlapped with each other to form a storage capacitor Cst.

For example, in some embodiments, with reference to FIGS. 3A and 3D, the second conductive layer further includes a light shielding portion 791. An orthographic projection of the light-shielding portion 791 on the base substrate 210 covers at least part of the active layer of the second thin-film transistor T2, and the active layer between the drain electrode of the third thin-film transistor T3 and the drain electrode of the fourth thin-film transistor T4, thereby preventing external light from affecting the active layers of the second thin-film transistor T2, the third thin-film transistor T3, and the fourth thin-film transistor T4. The light shielding portion 791 for example is electrically connected to the first power line VDD through a via hole VH9 penetrating through the insulating layer, as shown in FIGS. 3A and 4C.

Figure 3I:
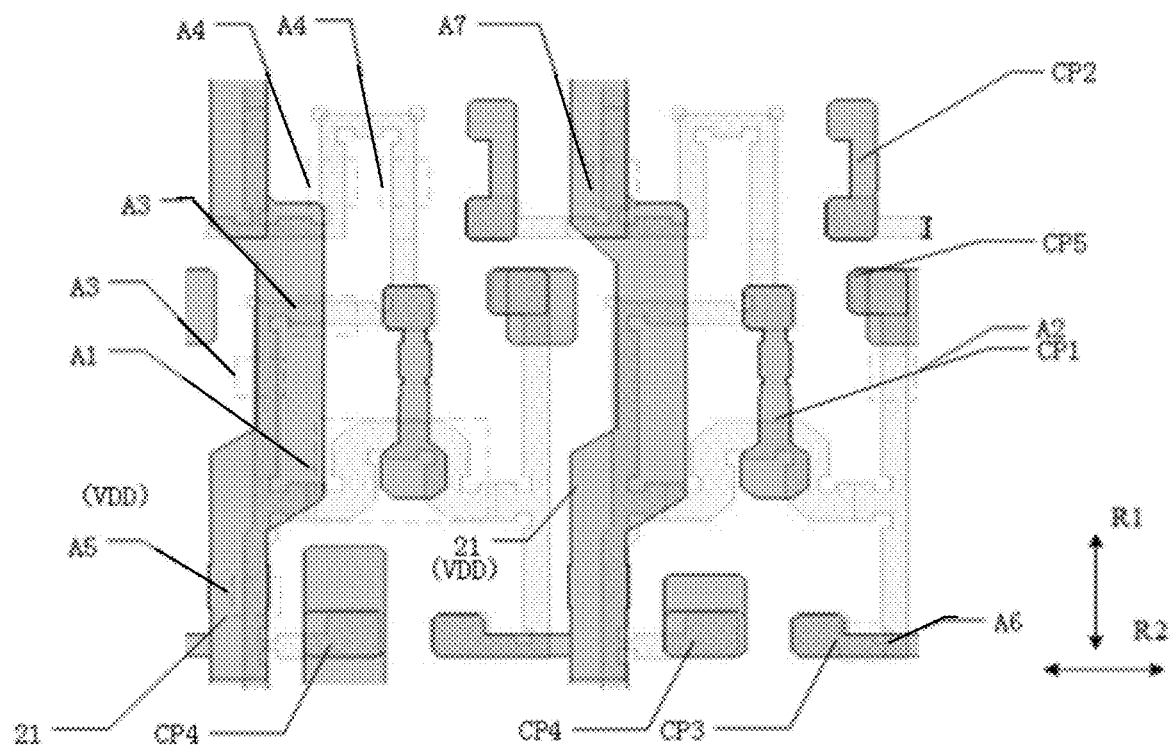
Figure 3J:
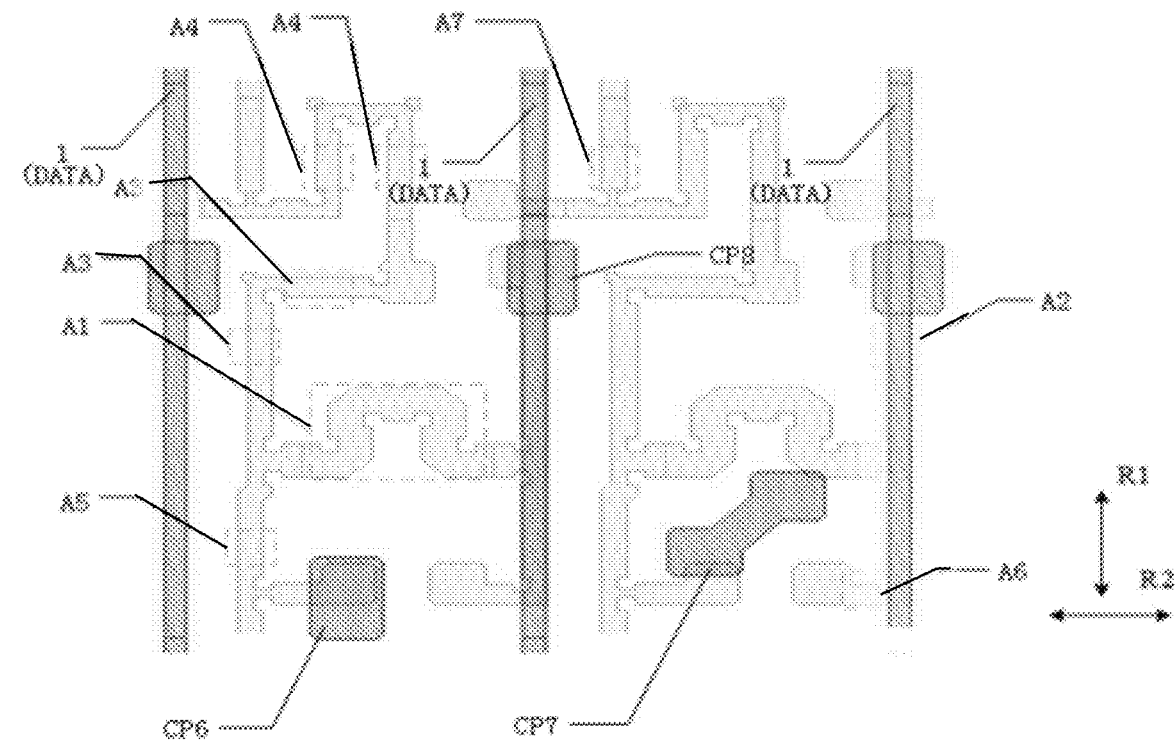
Figure 3K:
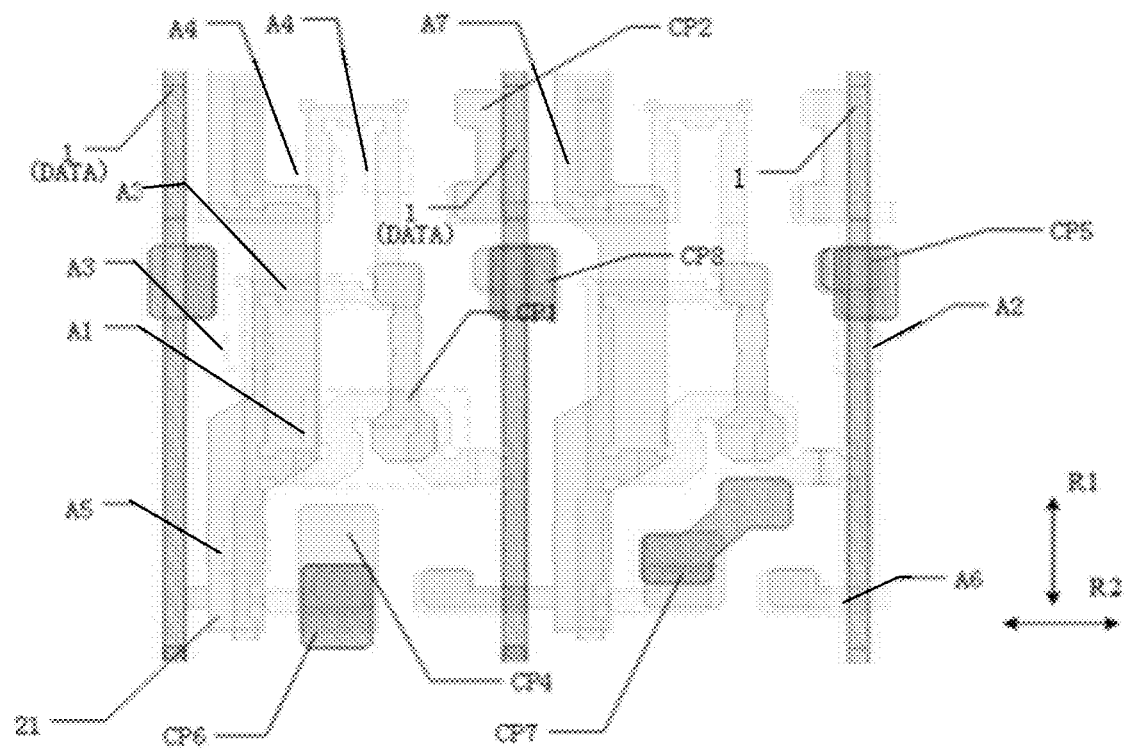

In at least one embodiment of the present disclosure, as shown in FIGS. 3A and 3K, for example, in one sub-pixel, the first connection structure CP1 is provided between the first sub-wire 21 and the data line 1 (the data line 1 belongs to the pixel circuit of the same sub-pixel as the first connection structure CP1 and the first sub-wire 21) in the lateral direction R2. In this case, no structure extending along the first direction R1, such as the first power line, is provided in the lateral direction R2 between the first connection structure CP1 and the data line 1, so that the distance between the first connection structure CP1 and the data line 1 is smaller; if the first connection structure CP1 and the data line 1 are provided in a same layer, the more significant parasitic capacitance is formed in the lateral direction between the first connection structure CP1 and the data line 1. In the embodiments of the disclosure, by providing the first connection structure CP1 and the data line 1 in different layers of the array substrate, more remarkable effect on reducing the signal interference of the data line 1 to the first connection structure CP1 is achieved.

In addition, compared with the case where the first sub-wire 21 is provided between the first connection structure CP1 and the data line (the data line belongs to the pixel circuit of the same sub-pixel as the first connection structure CP1 and the first sub-wire 21), the length of the first connection structure CP1 in the first direction R1 is relatively small, and the width of the first connection structure CP1 in the lateral direction R2 is also relatively small. Thus, the second conductive layer further comprises the above-mentioned light shielding portion 791 to shield the active layers of the second thin-film transistor T2, the third thin-film transistor T3 and the fourth thin-film transistor T4. The second conductive layer can be used to achieve the above purpose, so that the manufacturing process of the array substrate can be simplified.

For example, as shown in FIG. 4A, the array substrate 100 further includes a second insulating layer 152. The second insulating layer 152 is provided between the first electrode plate CE1 of the storage capacitor Cst and the second electrode plate CE2 of the storage capacitor Cst, that is, between the first conductive layer and the second conductive layer. For clarity purpose, the second insulating layer 152 is not shown in FIGS. 3B-3F either.

The array substrate 100 further includes a second power line VSS. For example, the first power line VDD is a power line that provides a high voltage to the pixel circuit; the second power line VSS is connected to a second voltage terminal and is a power line that provides a low voltage (lower than the above-mentioned high voltage) for the pixel circuit. In the embodiments shown in FIG. 2, the first power line VDD provides a first power voltage which is constant, and the first power voltage is a positive voltage; the second power line VSS provides a second power voltage which is constant, and the second power voltage for example is a negative voltage, and so on. For example, in some examples, the second power voltage is a grounding voltage.

In some embodiments, for example, as shown in FIG. 4A, the data line 1 (DATA) is provided on the side of the first connection structure CP1 away from the base substrate 210. In this case, for example, FIG. 3E shows the third conductive layer of the pixel circuit, and FIG. 3I shows a schematic diagram after the third conductive layer and the semiconductor layer are laminated. The third conductive layer is provided on the side of the second conductive layer away from the base substrate 1. For example, as shown in FIGS. 3E and 3I, the third conductive layer of the pixel circuit includes the first connection structure CP1 and the first sub-wire 21 of the first power line VDD, that is, the first connection structure CP1 and the first sub-wire 21 are arranged in the same layer. As shown in FIG. 4A, the array substrate 100 further includes a third insulating layer 160. The third insulating layer 160 is provided between the second electrode plate CE2 of the storage capacitor Cst and the first connection structure CP1, that is, between the second conductive layer and the third conductive layer.

For example, the first sub-wire 21 is electrically connected to the second sub-wire 22 through a via hole (for example, a via hole VH3) penetrating through the third insulating layer 160.

For example, with reference to FIGS. 3A, 3E, 4A and 4C, the third conductive layer further includes a second connection structure CP2, a third connection structure CP3, and a fourth connection structure CP4. One end of the first connection structure CP1 is connected with the first electrode plate CE1 of the storage capacitor Cst through a via hole (for example, a via hole VH5) that penetrates through each of the second insulating layer 152 and the third insulating layer 160 and exposes a part of the first electrode plate CE1 of the storage capacitor Cst. The other end of the first connection structure CP1 is connected to the semiconductor layer, for example, to the drain region of the semiconductor layer corresponding to the third thin-film transistors T3, through at least one via hole (for example, a via hole VH4) that penetrates through each of the first insulating layer 151, the second insulating layer 152, and the third insulating layer 160. One end of the second connection structure CP2 is connected to the reset signal line RL through a via hole (for example, a via hole VH6) that penetrates through the third insulating layer 160; and the other end of the second connection structure CP2 is connected to the semiconductor layer, for example, to the source region of the seventh thin-film transistor T7 and the source region of the fourth thin-film transistor T4 in the semiconductor layer, through at least one via (for example, a via hole VH7) that penetrates through each of the first insulating layer 151, the second insulating layer 152, and the third insulating layer 160. The third connection structure CP3 is connected to the drain region of the sixth thin-film transistor T6 in the semiconductor layer through at least one via hole (for example, a via hole VH8) that penetrates through each of the first insulating layer 151, the second insulating layer 152, and the third insulating layer 160. The fourth connection structure CP4 is connected to the drain region of the fifth thin-film transistor T5 in the semiconductor layer through at least one via hole (for example, a via hole VH2) that penetrates through each of the first insulating layer 151, the second insulating layer 152, and the third insulating layer 160. The fifth connection structure CP5 is connected to the drain region of third thin-film transistor T3 in the semiconductor layer through at least one via hole (for example, via hole VH1) that penetrates through each of the first insulating layer 151, the second insulating layer 152, and the third insulating layer 160, and exposes part of the semiconductor layer.

For example, FIG. 3F shows the fourth conductive layer of the pixel circuit, FIG. 3J shows a schematic diagram after the fourth conductive layer and the semiconductor layer are laminated, and FIG. 3K shows a schematic diagram after the fourth conductive layer, the third conductive layer and the semiconductor layer are laminated. For example, as shown in FIGS. 3A, 3E-3F, 3J-3K, and 4A, the fourth conductive layer is provided on a side of the third conductive layer away from the base substrate 210. The fourth conductive layer includes a data line 1 (DATA), a sixth connection structure CP6, and a seventh connection structure CP7. The array substrate 100 further includes a fourth insulating layer 113. The fourth insulating layer 113 is provided between the third conductive layer and the fourth conductive layer, that is, between the first connection structure CP1 and the data line 1 (DATA). For example, the fourth insulating layer 113 is a planarization layer. The via hole VH1 further penetrates through the fourth insulating layer 113 to expose at least part of the fifth connection structure CP5, and the data line 1 (DATA) is electrically connected to the fifth connection structure CP5 through the via hole VH1, so that the data line 1 (DATA) is electrically connected to the drain region of the third thin-film transistor T3 in the semiconductor layer. For example, the seventh connection structure CP7 directly contacts the data line 1, so that the seventh connection structure CP7 is electrically connected with the data line 1. Because the line width of the data line 1 is relatively small, for example, significantly smaller than the line width of the first sub-wire 21, the seventh connection structure CP7 widens the part of the data line 1 that needs to be connected to the semiconductor layer. For example, the whole structure made up of the data line 1 and the seventh connection structure CP7 is electrically connected to the fifth connection structure CP5 through the via hole VH1, so that the data line 1 (DATA) is electrically connected to the drain region of the third thin-film transistor T3 in the semiconductor layer. For example, the seventh connection structure CP7 and the data line 1 are integrally formed. For example, the via hole VH2 further penetrates through the fourth insulating layer 113 to expose at least part of the fourth connection structure CP4, and the sixth connection structure CP6 is electrically connected to the fourth connection structure CP4 through the via hole VH2, so that the sixth connection structure CP6 is electrically connected to the drain region of the active layer corresponding to the fifth thin-film transistor T5 and serves as the drain electrode of the fifth thin-film transistor T5. For example, the sixth connection structure CP6 is configured to connect to the anode of the light emitting element (for example, the anode 181 shown in FIG. 6). For example, the shape, size, and position of the sixth connection structure CP6 may not be completely the same in different sub-pixels, such as in the two adjacent sub-pixels 1030 shown in FIG. 3A, so as to be adaptable to the position requirement of the anode in different sub-pixels. For example, the shape, size, and position of the sixth connection structure CP6 in the left sub-pixel 1030 shown in FIG. 3A are different from the shape, size, and position of the sixth connection structure CP6 in the right sub-pixel 1030. This is because the positions of the anodes in the two sub-pixels are different from each other. The shape, size, and position of the sixth connection structure CP6 are set in such a way that the sixth connection structure CP6 extends along a direction intersecting the first direction R1 and the lateral direction R2, so that the sixth connection structure CP6 can be connected to the anode provided at an upper end (not the end connected to the fourth connection structure CP4) of the sixth connection structure CP6.

For example, a thickness of the fourth insulating layer 113 in the direction perpendicular to the base substrate 210 is greater than at least one of a thickness of the first insulating layer 151 in the direction perpendicular to the base substrate 210, a thickness of the second insulating layer 152 in the direction perpendicular to the base substrate 210, and a thickness of the third insulating layer 160 in the direction perpendicular to the base substrate 210, so that the insulating effect of the fourth insulating layer 113 can be enhanced, and the parasitic capacitance between the data line 1 and the first connection structure CP1 can be better reduced or avoided.

For example, the thickness of the fourth insulating layer 113 in the direction perpendicular to the base substrate 210 is several microns, for example, within a range of 5 μm~10 μm. This thickness range can better reduce or avoid the parasitic capacitance between the data line 1 and the first connection structure CP1, and will not excessively increase the thickness of the array substrate 100.

In the above-mentioned embodiments, the first sub-wire 21 and the data line 1 are arranged in different layers. Because the distance between the first sub-wire 21 and the data line 1 adjacent to each other is relatively small in the lateral direction, this design can avoid the parasitic capacitance generated between the first sub-wire 21 and the data line 1, so as to prevent the parasitic capacitance from affecting the display effect. For example, the first sub-wire 21 and the data line 1 adjacent to each other correspond to two adjacent sub-pixels, respectively.

With reference to FIGS. 3A and 4A, for example, the orthographic projection of the first connection structure CP1 on the base substrate 210 is not overlapped with the orthographic projection of the data line 1 on the base substrate 210; and the orthographic projection of the first sub-wire 21 on the base substrate 210 is not overlapped with the orthographic projection of the data line 1 on the base substrate 210. Compared with the case where the above signal lines are overlapped with each other in the direction perpendicular to the base substrate 210, the solution of the embodiments of the present disclosure can better prevent the crosstalk between signals of these signal lines.

For example, in order to reduce the resistance of the data line and the first connection structure, the data line 1 and the first connection structure CP1 for example are made from a metallic material. For example, the fourth conductive layer for forming the data line 1 adopts a laminated structure of three metal layers, such as Ti/Al/Ti.

FIG. 4C is a schematic cross-sectional diagram taken along the line B-B' in FIG. 3A. The plurality of sub-pixels includes a first sub-pixel and a second sub-pixel adjacent to the first sub-pixel. FIG. 3A shows two adjacent sub-pixels, the first sub-pixel is the sub-pixel on the left of FIG. 3A, and the second sub-pixel is the sub-pixel on the right of FIG. 3A, that is, the first sub-pixel and the second sub-pixel are adjacent to each other in the lateral direction. For example, the first sub-pixel and the second sub-pixel in other embodiments are adjacent to each other in a vertical direction, in this case, the directions and positions of other structures may be adjusted accordingly. With reference to FIGS. 3A, 3G and 4C, the first reset transistor T4 includes an active layer A4, a gate electrode (a part of the second gate line GLn−1 overlapped with the active layer A4), a first electrode (for example, a source electrode), and a second electrode (for example, a drain electrode). The second reset transistor T7 includes an active layer A7, a gate electrode (a part of the second gate line GLn−1 overlapped with the active layer A7), a first electrode (for example, a source electrode), and a second electrode (for example, a drain electrode). The active layer of the first reset transistor T4 includes a channel region (a part of the active layer A4 overlapped with the second gate line GLn−1) and an electrode region E1. The active layer A7 of the second reset transistor T7 includes a channel region (a part of the active layer A7 overlapped with the second gate line GLn−1) and an electrode region E1. The first reset transistor T4 and the second reset transistor T7 share the same electrode region E1. For example, the second connection structure CP2 extends along the first direction R1 and includes a first end and a second end opposite to each other in the first direction R1; the second connection structure CP2 of the pixel circuit of the second sub-pixel is provided on a side of, close to the data line 1 of the pixel circuit of the first sub-pixel, of the channel region of the active layer of the first reset transistor T4 and the channel region of the active layer of the second reset transistor T7 in the pixel circuit of the first sub-pixel in the lateral direction. The first end of the second connection structure CP2 is electrically connected to the reset signal line RL through the via hole VH6, and the second end of the second connection structure CP2 is electrically connected to the electrode region E1 of the active layers of the reset transistors (T4 and T7) in the pixel circuit of the second sub-pixel through the via hole VH7. Thus, the second connection structure CP2 constitutes the first electrode and the second electrode of the first reset transistor T4 and the second reset transistor T7.

With reference to FIGS. 3A, 3G, and 4C, the electrode region E1 of the active layers of the first reset transistor T4 and the second reset transistor T7 in the pixel circuit of the second sub-pixel extends from the first sub-pixel to the adjacent second sub-pixel along the lateral direction; and an orthographic projection of the electrode region E1 of the active layers of the first reset transistor T4 and the second reset transistor T7 in the pixel circuit of the second sub-pixel on the base substrate is at least partially overlapped with the orthographic projection of the data line 1, belonging to the pixel circuit of the first sub-pixel, on the base substrate. That is, the electrode region E1 of the active layers of the first reset transistor T4 and the second reset transistor T7 intersects the data line 1, so as to achieve more flexible and fuller usage of the limited pixel area and to form the required pattern of the semiconductor layer to facilitate connecting with other structures. Because the electrode region E1 of the active layer that is overlapped with the orthographic projection of the data line 1 is far away from the fourth conductive layer where the data line 1 is located in the direction perpendicular to the base substrate, the intersection of the data line 1 and the electrode region E1 will not interfere with each other on their signals.

It should be noted that three data lines 1 are shown in FIGS. 3A, 3F, 3J, and 3K, respectively, and the three data lines 1 belong to the pixel circuits of three adjacent sub-pixels, respectively; the data line 1 in the middle belongs to the pixel circuit of the first sub-pixel, and the data line 1 on the right side belongs to the pixel circuit of the second sub-pixel.

Figure 5:
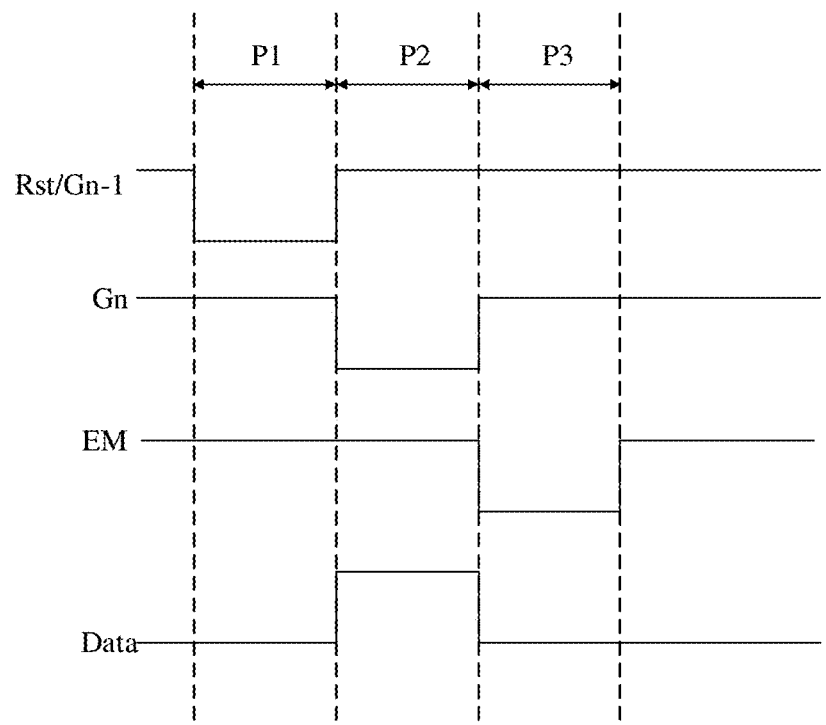
FIG. 5 is a signal timing diagram of a working process of the pixel circuit shown in FIG. 2.

FIG. 5 is a signal timing diagram of the pixel circuit shown in FIG. 2. The working principle of the pixel circuit shown in FIG. 2 will be described below with reference to the signal timing diagram shown in FIG. 5. As an example herein, the first light-emitting control line EM1 and the second light-emitting control line EM2 in FIG. 2 are for example the same common light-emitting control line. In some other embodiments, the first light-emitting control line EM1 and the second light-emitting control line EM2 for example are different signal lines to respectively provide a first light-emitting control signal and a second light-emitting control signal different from each other.

In addition, as an example herein, all the transistors shown in FIG. 5 are P-type transistors. The gate electrode of each P-type transistor is turned on while the low level is applied, and is turned off while the high level is applied. The following embodiments are the same as this, and will not be repeated here.

As shown in FIG. 5, the working process of the pixel circuit includes three stages, namely a reset stage P1, a data writing and compensation stage P2, and a light-emitting stage P3. FIG. 5 shows the timing waveform of various signals in each stage.

In the reset phase P1, the second gate line Gn−1 provides a reset signal Rst, and the fourth thin-film transistor T4 and the seventh thin-film transistor T7 are turned on by the low level of the reset signal; the reset signal (low-level signal, for example, may be grounded or other low-level signals) is applied to the first gate electrode of the first thin-film transistor T1, and the reset signal is applied to the N4 node; in this way, the light emitting element 180 is reset, so that the light emitting element 180 displays in a black state without emitting light before the light-emitting stage P3, thereby improving the display effect, such as the contrast, of the display device using the pixel circuit. At the same time, the second thin-film transistor T2, the third thin-film transistor T3, the fifth thin-film transistor T5, and the sixth thin-film transistor T6 are turned off by the high-level signals respectively applied to them.

In the data writing and compensation phase P2, the first gate line GLn provides the scan signal Gn−1, the data line DAT provides the data signal Data, and the second thin-film transistor T2 and the third thin-film transistor T3 are turned on. At the same time, the fourth thin-film transistor T4, the fifth thin-film transistor T5, the sixth thin-film transistor T6, and the seventh thin-film transistor T7 are turned off by the high-level signals respectively applied to them. After the data signal Data passes through the second thin-film transistor T2, the first thin-film transistor T1 and the third thin-film transistor T3, the first node N1 is charged (i.e., the storage capacitor Cst is charged), that is, the potential of the first node N1 gradually increases. It is easy to be understood that because the second thin-film transistor T2 is turned on, the potential of the second node N2 remains at Vdata; according to the characteristics of the first thin-film transistor T1, while the potential of the first node N1 is increased to Vdata+Vth, the first thin-film transistor T1 is turned off and the charging process is completed. It should be noted that Vdata represents the voltage value of the data signal Data, and Vth represents the threshold voltage of the first thin-film transistor T1. Because the first thin-film transistor T1 in the embodiments is described as the P-type transistor, the threshold voltage Vth herein for example is a negative value.

After the data writing and compensation phase P2, the potentials of the first node N1 and the third node N3 are both Vdata+Vth, that is, the voltage information including the data signal Data and the threshold voltage Vth is stored in the storage capacitor Cst, so as to provide gray-scale display data and compensate for the threshold voltage of the first thin-film transistor T1 during the subsequent light-emitting stage.

In the light emitting phase P3, the light-emitting control line provides the light-emitting control signal EM, and the fifth thin-film transistor T5 and the sixth thin-film transistor T6 are turned on by the low level of the light-emitting control signal EM. The second thin-film transistor T2, the third thin-film transistor T3, the fourth thin-film transistor T4, and the seventh thin-film transistor T7 are turned off by the high level respectively applied to them. At the same time, the potential of the first node N1 is Vdata+Vth, and the potential of the second node N2 is VDD, so the first thin-film transistor T1 keeps in turn-on state at this stage. The anode and cathode of the light emitting element 180 are respectively applied with the first power voltage (high voltage) provided by the first power line VDD and the second voltage VSS (low voltage), so that the light emitting element 180 emits the light under the action of electric current passing through the first thin-film transistor T1.

Figure 4B:
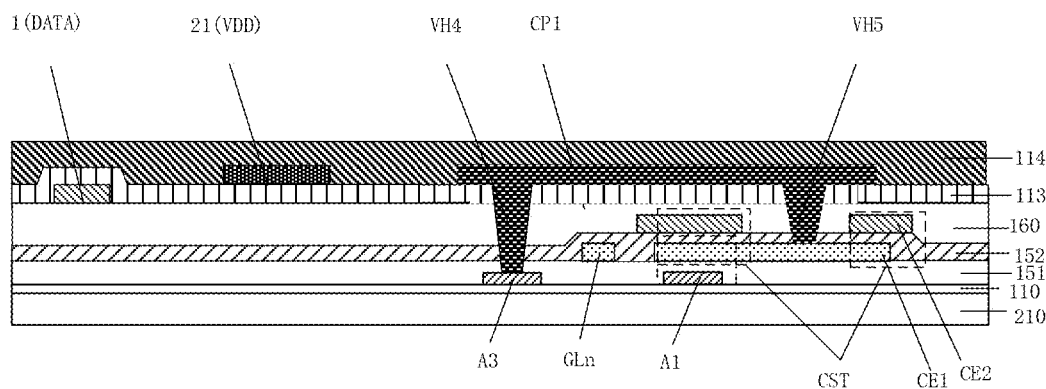
FIG. 4B is another schematic cross-sectional diagram taken along the line A-A' in FIG. 3A.
Figure 4C:
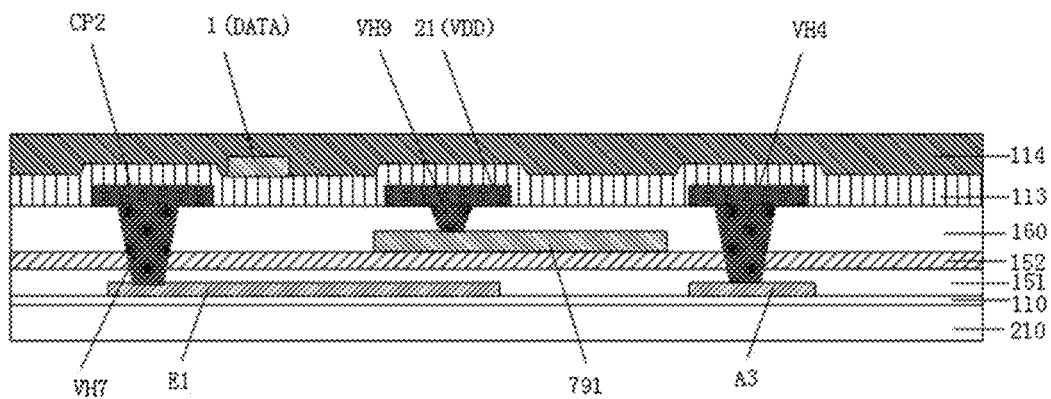
FIG. 4C is a schematic cross-sectional diagram taken along the line B-B' in FIG. 3A.

For example, in other embodiments, as shown in FIG. 4B, there exist the following differences from the structure shown in FIG. 4A. The data line 1 (DATA) is provided on the side of the first connection structure CP1 close to the base substrate 210. For example, in this embodiment, the data line 1 (DATA) and the seventh connection structure CP7 shown in FIG. 3F are provided in the third conductive layer; and the first connection structure CP1 and the first sub-wire 21 shown in FIG. 3E are provided in the fourth conductive layer, and the fourth conductive layer is provided on the side of the third conductive layer away from the base substrate 210. For example, in other embodiments, the first sub-wire 21 and the data line 1 (DATA) are arranged in the same layer. According to the previous description, the first sub-wire 21 and the data line 1 (DATA) arranged in different layers are more conducive to avoid signal crosstalk between the two. The third insulating layer 160 is provided between the third conductive layer and the second conductive layer, that is, between the second electrode plate CE2 of the storage capacitor Cst and the data line 1 (DATA). The fourth insulating layer 113 is provided between the third conductive layer and the fourth conductive layer, that is, between the data line 1 (DATA) and the first connection structure CP1. For example, the structure of the other layers is the same as that in the embodiment shown in FIG. 4A. The data line 1 (DATA) is electrically connected to the semiconductor layer through a via hole that penetrates through each of the first insulating layer 151, the second insulating layer 152, and the third insulating layer and exposes a part of the semiconductor layer. The first connection structure CP1 is connected to the first electrode plate CE1 of the storage capacitor Cst through a via hole that penetrates through each of the second insulating layer 152, the third insulating layer 160, and the fourth insulating layer 113 and exposes a part of the first electrode plate CE1 of the storage capacitor Cst. The embodiment shown in FIG. 4B can also achieve the same or similar technical effects. For other features, reference may be made to the description of the embodiment shown in FIG. 4A; and for some specific structures, those skilled in the art can adjust accordingly as required based on the embodiment shown in FIG. 4A, in order to achieve more reasonable connections. The adjustments made by those skilled in the art are not limited in the embodiments of the present disclosure, as long as the data line 1 (DATA) is provided on the side of the first connection structure CP1 that is close to the base substrate 210.

FIG. 6 is a schematic cross-sectional diagram of a part of the sub-pixel of the array substrate in FIG. 1. As shown in FIG. 6, the pixel circuit of each sub-pixel 1030 in the display area of the array substrate 100 includes a light-emitting control transistor (for example, the sixth transistor T6 in FIG. 2 which is for example a thin-film transistor (TFT)), a light emitting element 180, and a storage capacitor Cst. The light-emitting control transistor includes an active layer 120, a gate electrode 121, a source electrode 122, and a drain electrode 123; and the storage capacitor Cst includes a first electrode plate CE1 and a second electrode plate CE2. The light emitting element 180 includes a cathode 183, an anode 181, and a light-emitting layer 182 between the cathode 183 and the anode 181. The anode 181 is electrically connected to the drain electrode 123 of the thin-film transistor TFT through a relay electrode 171, and the relay electrode 171 is provided in the fourth conductive layer. The array substrate 100 further includes a fifth insulating layer 114, which is provided between the fourth conductive layer and the anode 181 and covers the fourth conductive layer. The relay electrode 171 is electrically connected to the drain electrode 123 through a via hole that penetrates through the fourth insulating layer 113. For example, the light emitting element may be, for example, an organic light emitting diode (OLED) or a quantum-dot light emitting diode (QLED), and accordingly, the light emitting layer 182 is an organic light emitting layer or a quantum-dot light emitting layer. For example, the fifth insulating layer 114 is a planarization layer, so that the display device 180 can be disposed thereon. For example, the fifth insulating layer 114 is made from a material such as silicon oxide, silicon nitride, or silicon oxynitride. The material of other insulating layers can refer to the material of the fifth insulating layer 114, and the present disclosure does not limit the material of each insulating layer.

For example, as shown in FIG. 6, the array substrate 100 further includes an encapsulation layer 190, and the encapsulation layer 190 seals the display area 101. The encapsulation layer 190 includes a plurality of encapsulation sub-layer 191/192/193. Certainly, the encapsulation layer 190 is not limited to three layers, and it may also be two, four, five, or more layers. For example, a first encapsulation layer 291 and the first encapsulation sub-layer 191 of the encapsulation layer 190 are arranged in the same layer; the second encapsulation layer 292 and the second encapsulation sub-layer 192 of the encapsulation layer 190 are arranged in the same layer; and the third encapsulation layer 293 and the third encapsulation sub-layer 193 of the encapsulation layer 190 are arranged in the same layer. For example, both the first encapsulation layer 291 and the third encapsulation layer 293 include an inorganic encapsulation material, such as silicon oxide, silicon nitride, or silicon oxynitride; the second encapsulation layer 292 includes an organic material, such as a resin material. The multi-layer encapsulation structure can achieve better packaging effect to prevent impurities such as water vapor or oxygen from penetrating into the display area 101.

In some embodiments, as shown in FIG. 6, the array substrate 100 further includes a buffer layer 111 on the base substrate 210. The buffer layer 111 serves as a transition layer, which not only prevents harmful substances in the base substrate 210 from intruding into the array substrate 20, but also enhances the adhesion between the layers in the array substrate 100 and the base substrate 210. For example, the material of the buffer layer 111 may include a single-layer or multi-layer structure made from an insulating material, such as silicon oxide, silicon nitride, or silicon oxynitride.

For example, the array substrate provided by the embodiments of the present disclosure is an organic light emitting diode (OLED) array substrate. For example, the array substrate provided by the embodiments of the present disclosure is a display substrate configured to display, for example, an organic light emitting diode (OLED) display substrate.

Figure 7:
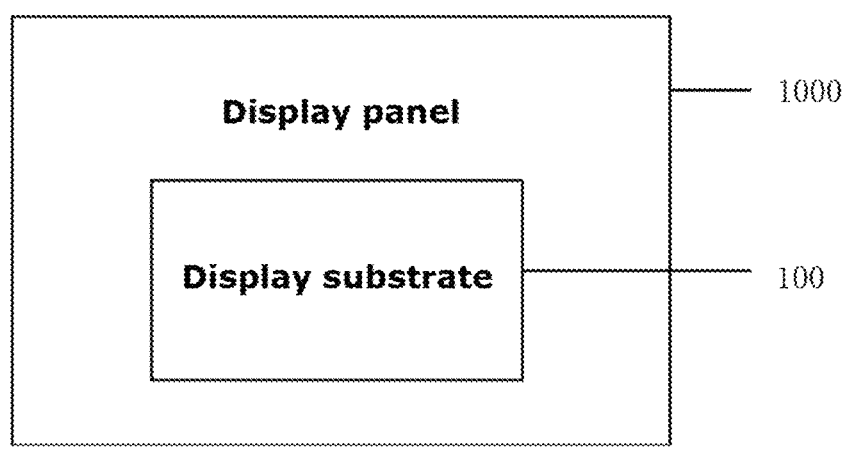
FIG. 7 is a schematic diagram of a display panel provided by the embodiments of the present disclosure.

For example, at least one embodiment of the present disclosure further provides a display panel including any one of the array substrates provided by the embodiments of the present disclosure. FIG. 7 is a schematic diagram of a display panel provided by the embodiments of the present disclosure. As shown in FIG. 7, the display panel 1000 provided by at least one embodiment of the present disclosure includes any one of the array substrates 100 provided by the embodiments of the present disclosure. Other structures of the display panel 1000 can be designed according to specific requirements by using conventional techniques in the art, which are not limited in the present disclosure.

For example, at least one embodiment of the present disclosure further provides a display device, which includes any one of the display panels provided by the embodiments of the present disclosure.

For example, the display device may be an organic light emitting diode (OLED) display device. For example, it may be a product such as a mobile phone, a tablet computer, a monitor, a notebook computer, and an ATM (Automatic Teller Machine). Other structures of the display device can be designed according to specific requirements by using conventional techniques in the art.

The foregoing embodiments merely are exemplary embodiments of the disclosure, and not intended to define the scope of the disclosure, and the scope of the disclosure is determined by the appended claims.

The invention claimed is:
1. An array substrate, comprising:
a base substrate provided with a plurality of pixels arranged in an array, wherein each of the plurality of pixels comprises a plurality of sub-pixels, each of the plurality of sub-pixels comprises a pixel circuit, and the pixel circuit comprises:
a light emitting element, a storage capacitor, a driving transistor, and a data writing transistor, a third thin film transistor, a first conductive layer, and a second conductive layer wherein each of the driving transistor and the data writing transistor comprises an active layer, a gate electrode, a first electrode, and a second electrode, and the driving transistor is configured to control the light emitting element to emit light;
a data line connected to the first electrode of the data writing transistor and configured to provide a data signal for the data writing transistor, wherein the data writing transistor is configured to write the data signal into the gate electrode of the driving transistor in response to a first scan signal applied to the gate electrode of the data writing transistor; and
a first connection structure connected to both the gate electrode of the driving transistor and a first electrode plate of the storage capacitor, wherein the first connection structure and the data line are provided in different layers;
an insulating layer provided the first connection structure and the data line;
a first power line connected to a first voltage terminal and a second electrode plate of the storage capacitor;
the second conductive layer includes a light shielding portion, an orthographic projection of the light-shielding portion on the base substrate covers double-channel regions of the third thin-film transistor, the orthographic projection of the light-shielding portion is not overlapped with an orthographic projection of the data line on the base substrate, and the light shielding portion is electrically connected to the first power line.

2. The array substrate according to claim 1, wherein the data line and the first connection structure both extend along a first direction, and an orthographic projection of the first connection structure on the base substrate and an orthographic projection of the data line on the base substrate are at least partially opposite to each other in a lateral direction, the lateral direction is parallel to the base substrate and perpendicular to the first direction.

3. The array substrate according to claim 1, wherein the data line and the first connection structure both extend along a first direction, a distance between an orthographic projection of the first connection structure on the base substrate and an orthographic projection of the data line on the base substrate is smaller than a size of one of the plurality of sub-pixels in a lateral direction, the lateral direction is parallel to the base substrate and perpendicular to the first direction.

4. The array substrate according to claim 3, wherein a gap or almost no gap is provided between the orthographic projection of the first connection structure on the base substrate and the orthographic projection of the data line on the base substrate.

5. The array substrate according to claim 1, wherein the gate electrode of the driving transistor and the first electrode plate of the storage capacitor are provided in a same layer.

6. The array substrate according to claim 5, wherein
the gate electrode of the driving transistor and the first electrode plate of the storage capacitor are provided on a side of the active layer of the driving transistor away from the base substrate;
the second electrode plate of the storage capacitor is provided on a side of the gate electrode of the driving transistor and the first electrode plate of the storage capacitor away from the active layer.

7. The array substrate according to claim 5, wherein the data line is provided on a side of the first connection structure away from the base substrate.

8. The array substrate according to claim 7, further comprising:
a semiconductor layer, comprising the active layer of the driving transistor;
wherein the insulating layer comprises:
a first insulating layer provided between the active layer and the gate electrode of the driving transistor as well as the first electrode plate of the storage capacitor;
a second insulating layer provided between the first electrode plate of the storage capacitor and the second electrode plate of the storage capacitor;
a third insulating layer provided between the second electrode plate of the storage capacitor and the first connection structure;
a fourth insulating layer provided between the first connection structure and the data line;
a first via hole penetrating through each of the first insulating layer, the second insulating layer, the third insulating layer and the fourth insulating layer and exposing a part of the semiconductor layer, wherein the data line is electrically connected to the semiconductor layer through the first via hole; and
a second via hole penetrating through each of the second insulating layer and the third insulating layer and exposing a part of the first electrode plate of the storage capacitor, wherein the first connection structure is connected to the first electrode plate of the storage capacitor through the second via hole.

9. The array substrate according to claim 8, wherein a thickness of the fourth insulating layer in a direction perpendicular to the base substrate is greater than at least one of a thickness of the first insulating layer in the direction perpendicular to the base substrate, a thickness of the second insulating layer in the direction perpendicular to the base substrate, and a thickness of the third insulating layer in the direction perpendicular to the base substrate.

10. The array substrate according to claim 7, further comprising:
the first power line configured to provide a first voltage for a light-emitting control transistor, wherein the first power line comprises a first sub-wire extending along a first direction and a second sub-wire extending along a second direction, the first direction intersects the second direction, and the first sub-wire is electrically connected to the second sub-wire.

11. The array substrate according to claim 10, wherein
the first sub-wire and the first connection structure are provided in a same layer different from a layer in which the data line is provided;
the second sub-wire and the second electrode plate of the storage capacitor are provided in a same layer.

12. The array substrate according to claim 11, wherein in one of the plurality of sub-pixels, the first connection structure is provided in a lateral direction between the first sub-wire and the data line, and the lateral direction is parallel to the base substrate and perpendicular to the first direction.

13. The array substrate according to claim 10, wherein
an orthographic projection of the first connection structure on the base substrate is not overlapped with the orthographic projection of the data line on the base substrate, and an orthographic projection of the first sub-wire on the base substrate is not overlapped with the orthographic projection of the data line on the base substrate.

14. The array substrate according to claim 10, further comprising:
a third via hole, wherein the first sub-wire is electrically connected to the second sub-wire through the third via hole.

15. The array substrate according to claim 1, wherein each of the data line and the first connection structure is made from a metallic material.

16. The array substrate according to claim 2, further comprising a reset signal line, wherein
the plurality of sub-pixels comprise a first sub-pixel and a second sub-pixel adjacent to the first sub-pixel;
the pixel circuit further comprises: a reset transistor, configured to provide a reset signal for the sub-pixel and comprising an active layer, a gate electrode, a first electrode, and a second electrode, wherein the active layer of the reset transistor comprises a channel region and an electrode region; and a second connection structure, extending along the first direction and comprising a first end and a second end opposite to each other in the first direction;
the second connection structure of the pixel circuit of the second sub-pixel is provided on a side, close to the data line of the pixel circuit of the first sub-pixel, of the channel region of the active layer of the reset transistor in the pixel circuit of the first sub-pixel in the lateral direction;
the first end of the second connection structure of the pixel circuit of the second sub-pixel is electrically connected to the reset signal line, and the second end of the second connection structure is electrically connected to the electrode region of the active layer of the reset transistor in the pixel circuit of the second sub-pixel.

17. The array substrate according to claim 16, wherein
the electrode region of the active layer of the reset transistor in the pixel circuit of the second sub-pixel extends from the first sub-pixel into the second sub-pixel along the lateral direction; and
an orthographic projection of the electrode region of the active layer of the reset transistor of the pixel circuit of the second sub-pixel on the base substrate is at least partially overlapped with an orthographic projection of the data line belonging to the pixel circuit of the first sub-pixel on the base substrate.

18. The array substrate according to claim 16, wherein the second connection structure and the first connection structure are provided in a same layer.

19. A display panel, comprising an array substrate, wherein the array substrate comprises:
a base substrate provided with a plurality of pixels arranged in an array, wherein each of the plurality of pixels comprises a plurality of sub-pixels, each of the plurality of sub-pixels comprises a pixel circuit, and the pixel circuit comprises:
a light emitting element, a storage capacitor, a driving transistor, and a data writing transistor, a third thin film transistor, a first conductive layer, and a second conductive layer wherein each of the driving transistor and the data writing transistor comprises an active layer, a gate electrode, a first electrode, and a second electrode, and the driving transistor is configured to control the light emitting element to emit light;

a data line connected to the first electrode of the data writing transistor and configured to provide a data signal for the data writing transistor, wherein the data writing transistor is configured to write the data signal into the gate electrode of the driving transistor in response to a first scan signal applied to the gate electrode of the data writing transistor; and
a first connection structure connected to both the gate electrode of the driving transistor and a first electrode plate of the storage capacitor, wherein the first connection structure and the data line are provided in different layers;
an insulating layer provided the first connection structure and the data line;
a first power line connected to a first voltage terminal and a second electrode plate of the storage capacitor;
the second conductive layer includes a light shielding portion, an orthographic projection of the light-shielding portion on the base substrate covers double-channel regions of the third thin-film transistor, the orthographic projection of the light-shielding portion is not overlapped with an orthographic projection of the data line on the base substrate, and the light shielding portion is electrically connected to the first power line.

20. A display device, comprising a display panel, wherein the display panel comprises:
an array substrate, wherein the array substrate comprises:
a base substrate provided with a plurality of pixels arranged in an array, wherein each of the plurality of pixels comprises a plurality of sub-pixels, each of the plurality of sub-pixels comprises a pixel circuit, and the pixel circuit comprises:
a light emitting element, a storage capacitor, a driving transistor, and a data writing transistor, a third thin film transistor, a first conductive layer, and a second conductive layer wherein each of the driving transistor and the data writing transistor comprises an active layer, a gate electrode, a first electrode, and a second electrode, and the driving transistor is configured to control the light emitting element to emit light;
a data line connected to the first electrode of the data writing transistor and configured to provide a data signal for the data writing transistor, wherein the data writing transistor is configured to write the data signal into the gate electrode of the driving transistor in response to a first scan signal applied to the gate electrode of the data writing transistor; and
a first connection structure connected to both the gate electrode of the driving transistor and a first electrode plate of the storage capacitor, wherein the first connection structure and the data line are provided in different layers;
an insulating layer provided the first connection structure and the data line;
a first power line connected to a first voltage terminal and a second electrode plate of the storage capacitor;
the second conductive layer includes a light shielding portion, an orthographic projection of the light-shielding portion on the base substrate covers double-channel regions of the third thin-film transistor, the orthographic projection of the light-shielding portion is not overlapped with an orthographic projection of the data line on the base substrate, and the light shielding portion is electrically connected to the first power line.

* * * * *